(12) United States Patent
Saito et al.

(10) Patent No.: US 11,835,603 B2
(45) Date of Patent: Dec. 5, 2023

(54) OPTICALLY PUMPED MAGNETOMETER HAVING LASERS AND OPTICAL SYSTEMS USED TO DERIVE AN INTENSITY OF A MAGNETIC FIELD

(71) Applicants: HAMAMATSU PHOTONICS K.K., Hamamatsu (JP); Kyoto University, Kyoto (JP)

(72) Inventors: Akinori Saito, Hamamatsu (JP); Takahiro Moriya, Hamamatsu (JP); Takenori Oida, Hamamatsu (JP); Motohiro Suyama, Hamamatsu (JP); Tetsuo Kobayashi, Kyoto (JP)

(73) Assignees: HAMAMATSU PHOTONICS K.K., Hamamatsu (JP); Kyoto University, Kyoto (JP)

( * ) Notice: Subject to any disclaimer, the term of this patent is extended or adjusted under 35 U.S.C. 154(b) by 0 days.

(21) Appl. No.: 17/829,413

(22) Filed: Jun. 1, 2022

(65) Prior Publication Data
US 2022/0390533 A1 Dec. 8, 2022

(30) Foreign Application Priority Data
Jun. 4, 2021 (JP) ................................. 2021-094324

(51) Int. Cl.
*G01R 33/26* (2006.01)
(52) U.S. Cl.
CPC .................................... *G01R 33/26* (2013.01)
(58) Field of Classification Search
CPC .. G01R 33/26; G01R 33/0094; G01R 33/032; A61B 5/245
See application file for complete search history.

(56) References Cited

U.S. PATENT DOCUMENTS

| 11,029,375 B2 | 6/2021 | Kato et al. |
| 11,099,245 B2 | 8/2021 | Kobayashi et al. |
| 2014/0121491 A1* | 5/2014 | Zhang ................. A61B 5/6814 600/409 |
| 2018/0238974 A1* | 8/2018 | Shah .................... G01R 33/323 |
| 2021/0389396 A1 | 12/2021 | Saito et al. |

FOREIGN PATENT DOCUMENTS

| JP | 5823195 B2 | 11/2015 |
| JP | 2020-030161 A | 2/2020 |
| JP | 2020-030162 A | 2/2020 |
| JP | 2020-060378 A | 4/2020 |

\* cited by examiner

*Primary Examiner* — Jay Patidar
(74) *Attorney, Agent, or Firm* — Faegre Drinker Biddle & Reath LLP

(57) ABSTRACT

An optically pumped magnetometer includes cells configured to form a first cell region and a second cell region on a measurement target, a pump laser, a probe laser, a first optical system configured to cause pump light to be incident on the first cell region, a second optical system configured to cause the pump light having passed through the first cell region to be incident on the second cell region, a third optical system configured to cause first probe light to be incident on the first cell region, a fourth optical system configured to cause second probe light to be incident on the second cell region, detection portions configured to detect the first probe light having passed through the first cell region and the second probe light having passed through the second cell region, and a deriving portion configured to derive an intensity of a magnetic field.

16 Claims, 10 Drawing Sheets

OPTICALLY PUMPED MAGNETOMETER HAVING LASERS AND OPTICAL SYSTEMS USED TO DERIVE AN INTENSITY OF A MAGNETIC FIELD

TECHNICAL FIELD

The present disclosure relates to an optically pumped magnetometer.

BACKGROUND

Magnetoencephalography using optically pumped magnetometers is known (for example, refer to Japanese Patent No. 5823195). An optically pumped magnetometer measures a microscopic magnetic field by exciting alkali metal atoms through optical pumping and using spin polarization of the atoms.

SUMMARY

In magnetoencephalography using optically pumped magnetometers, a number of optically pumped magnetometers are disposed with narrow intervals therebetween. For this reason, it is desired to achieve miniaturization of optically pumped magnetometers.

An aspect of the present disclosure provides an optically pumped magnetometer which can be miniaturized.

According to an aspect of the present disclosure, there is provided an optically pumped magnetometer including at least one cell configured to be filled with an alkali metal vapor, be disposed in a first direction along a measurement target, and form a first cell region and a second cell region on the measurement target; a pump laser configured to emit pump light for exciting alkali metal atoms; a probe laser configured to emit probe light including first probe light and second probe light for detecting change in a polarization angle caused by a magnetic field in an excited state of the alkali metal atoms; a first optical system configured to cause the pump light to be incident on the first cell region in the first direction; a second optical system configured to cause the pump light having passed through the first cell region to be incident on the second cell region in the first direction; a third optical system configured to cause the first probe light to be incident on the first cell region in a second direction orthogonal to the first direction; a fourth optical system configured to cause the second probe light to be incident on the second cell region in the second direction; a detection portion configured to detect first probe light having passed through the first cell region and second probe light having passed through the second cell region; and a deriving portion configured to derive an intensity of a magnetic field related to a region having the pump light and the first probe light orthogonal to each other from change in the polarization angle of the first probe light within the first cell region and derive an intensity of a magnetic field related to a region having the pump light having passed through the first cell region and the second probe light orthogonal to each other from change in the polarization angle of the second probe light within the second cell region based on detection results of the detection portion.

In the optically pumped magnetometer according to the aspect of the present disclosure, the pump light is incident on the first cell region in the first direction, and the first probe light is incident on the first cell region in the second direction. Traveling directions of the pump light and the first probe light are orthogonal to each other within the first cell region. Further, the pump light having passed through the first cell region is incident on the second cell region in the first direction, and the second probe light is incident on the second cell region in the second direction. Traveling directions of the pump light having passed through the first cell region and the second probe light are orthogonal to each other within the second cell region. That is, the same pump light is consecutively incident throughout multiple cell regions. Further, the intensity of a magnetic field related to a region having them intersecting each other is derived using the pump light and the first probe light, and the intensity of a magnetic field related to a region having them intersecting each other is derived using the pump light and the second probe light. Accordingly, there is no need to cause the pump light to branch or prepare multiple pump lasers in a manner of corresponding to the number of cell regions. Therefore, the constitution related to the pump light can be simplified. Accordingly, it is possible to provide an optically pumped magnetometer which can be miniaturized.

The first cell region and the second cell region may be formed by multiple cells. Accordingly, each cell can be miniaturized.

The multiple cells may be disposed away from each other in a direction away from the measurement target. The deriving portion may perform noise removal processing by calculating a difference between an intensity of a magnetic field related to an area within the first cell region and an intensity of a magnetic field related to an area within the second cell region. According to such a constitution, since an influence of common-mode noise is manifested in each of the intensity of a magnetic field related to an area within the first cell region and the intensity of a magnetic field related to an area within the second cell region, common-mode noise is removed by calculating the difference therebetween. Accordingly, measurement accuracy of the optically pumped magnetometer can be improved.

The multiple cells may be disposed away from each other in a direction orthogonal to the first direction and extending along the measurement target. According to such a constitution, the cells are adjacent to each other in a horizontal direction along the measurement target. Since the same pump light is incident on cells adjacent to each other, there is no need to prepare a constitution related to the pump light for each cell. In this case, since an interval between cells adjacent to each other can be narrowed, the optically pumped magnetometer can be miniaturized.

The first cell region and the second cell region may be away from each other in a direction away from the measurement target and be formed by one cell. The deriving portion may perform noise removal processing by calculating a difference between an intensity of a magnetic field related to an area within the first cell region and an intensity of a magnetic field related to an area within the second cell region. Accordingly, the cell can have a simple constitution. In addition, since common-mode noise is removed, measurement accuracy of the optically pumped magnetometer can be improved.

At least the one cell may have a pair of end surfaces orthogonal to the first direction with an antireflection film attached to the end surfaces. According to such a constitution, when the pump light is incident on and emitted from the first cell region or the second cell region in the first direction, attenuation due to reflection of the pump light is curbed. Accordingly, electric power of the pump laser can be reduced.

The optically pumped magnetometer may further include an attenuation detection portion configured to detect attenuation of the pump light having passed through the second cell region. The deriving portion may revise at least one of an intensity of a magnetic field related to an area within the first cell region and an intensity of a magnetic field related to an area within the second cell region based on detection results of the attenuation detection portion. According to such a constitution, attenuation of the pump light is taken into consideration, and the intensity of a magnetic field related to an area within each cell region is revised. Accordingly, measurement accuracy of the optically pumped magnetometer can be improved.

The alkali metal may be potassium and rubidium. A density of the rubidium may be lower than a density of the potassium. The pump laser may emit the pump light for exciting atoms of the rubidium and transferring spin polarization of atoms of the rubidium to atoms of the potassium. The probe laser may emit the probe light for detecting change in a polarization angle caused by a magnetic field in an excited state of atoms of the potassium. According to such a constitution, if the pump light excites atoms of the rubidium, spin polarization of atoms of the rubidium is transferred to atoms of the potassium, and thus atoms of the potassium are excited. This phenomenon is caused due to spin exchange interaction between the potassium and the rubidium. Since the pump light excites the rubidium having a lower density, attenuation of the pump light is curbed. As a result, electric power of the pump laser can be reduced.

The second optical system may cause the pump light having passed through the first cell region to be turned back and be incident on the second cell region. In this case, since a short optical path can be set for the pump light, it is possible to provide an optically pumped magnetometer 1 which can be miniaturized.

According to the aspect of the present disclosure, it is possible to provide an optically pumped magnetometer which can be miniaturized.

DETAILED DESCRIPTION

Hereinafter, forms for performing the present invention will be described in detail with reference to the accompanying drawings. In description of the drawings, the same reference signs are applied to the same elements, and duplicate description thereof will be omitted.

First Embodiment

Figure 1A:
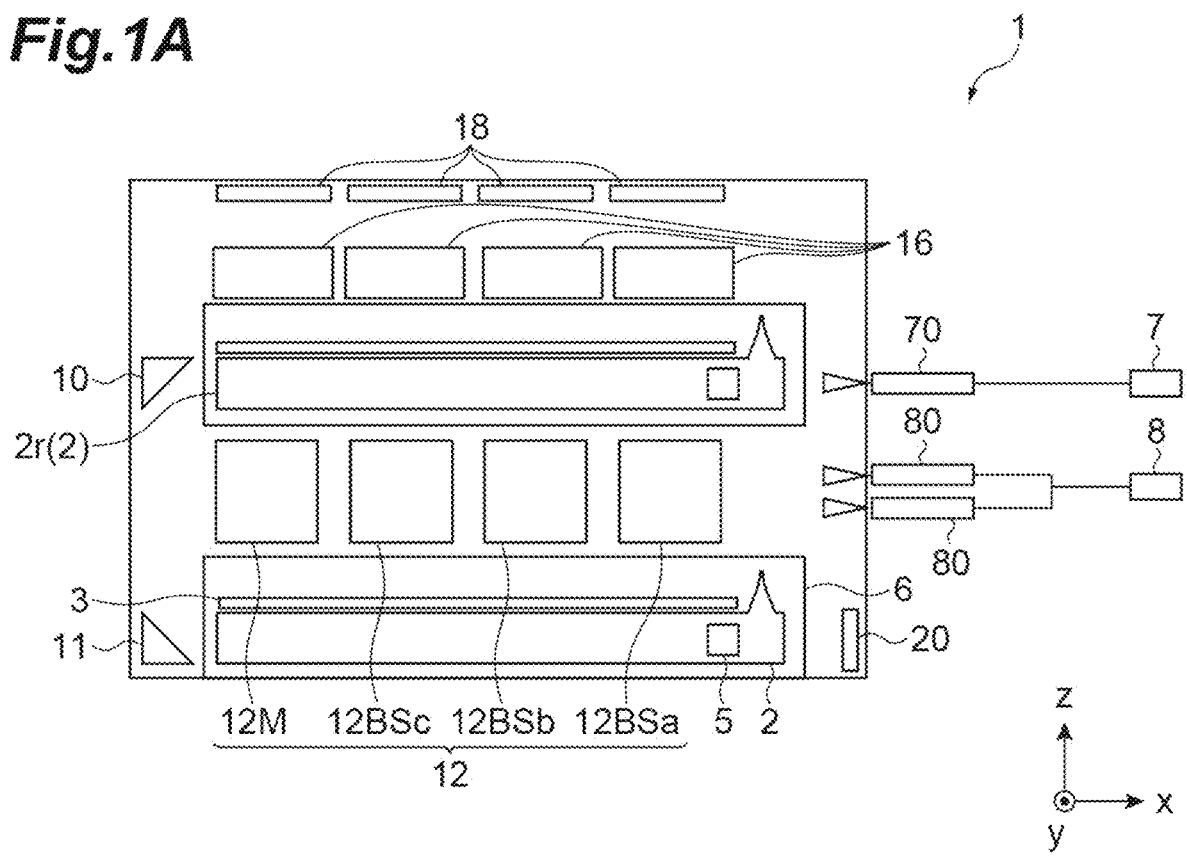
FIGS. 1A and 1B are views illustrating a constitution of an optically pumped magnetometer.
Figure 1B:
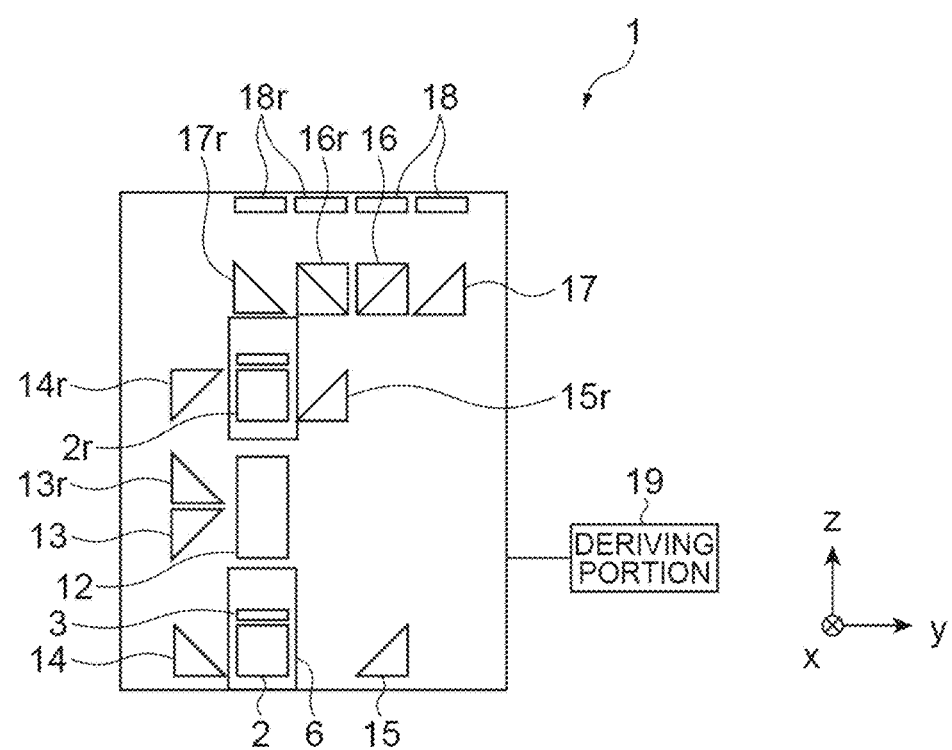

FIG. 1A and FIG. 1B are views illustrating a constitution of an optically pumped magnetometer 1. FIG. 1A is a view illustrating a constitution of the optically pumped magnetometer 1 when viewed from a side. FIG. 1B is a view illustrating a constitution of the optically pumped magnetometer 1 when viewed from the front. The optically pumped magnetometer 1 is a device for measuring a magnetic field utilizing optical pumping. In the present embodiment, the optically pumped magnetometer 1 will be described as being used for magnetoencephalographic measurement, but the usage is not limited thereto. As an example, a measurement target of the optically pumped magnetometer 1 is a cerebral magnetic field. In FIG. 1A and FIG. 1B, an x axis and a y axis are directions along a measurement target, and a z axis is a direction intersecting a measurement target (a direction away from a measurement target). The x axis, the y axis, and the z axis are orthogonal to each other. Hereinafter, a positive direction and a negative direction of the x axis will be generally referred to as "a first direction". In addition, a positive direction and a negative direction of the y axis will be generally referred to as "a second direction". Moreover, a positive direction and a negative direction of the z axis will be generally referred to as "a third direction".

As illustrated in FIG. 1A, the optically pumped magnetometer 1 includes a cell 2, a heater 3, a thermocouple 5, a case 6, a pump laser 7, a probe laser 8, mirrors 10 and 11, dividing portions 12, an attenuation detection portion 20, a pump connector 70, and a probe connector 80.

Figure 2:
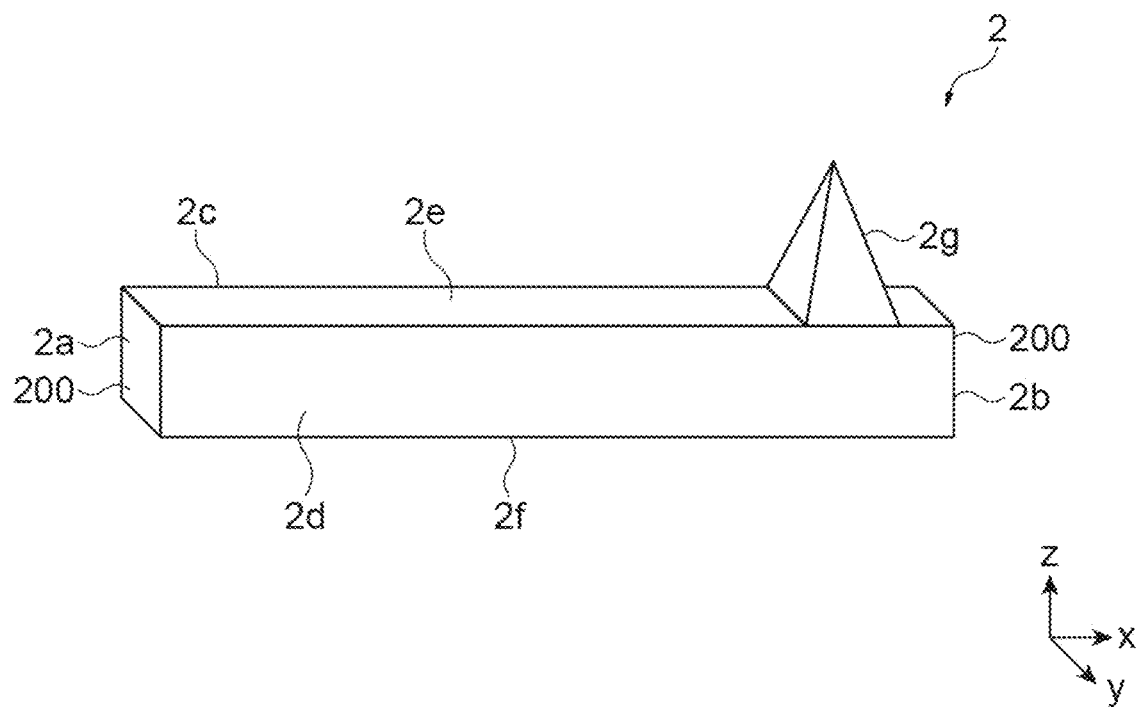
FIG. 2 is a perspective view illustrating an example of a cell according to a first embodiment.

The cell 2 is a container to be filled with an alkali metal vapor. The cell 2 is disposed in the first direction along a measurement target. Here, with reference to FIG. 2, details of the cell 2 will be described. The cell 2 substantially has a rectangular parallelepiped bottomed tubular shape. A cross section of the cell 2 in a direction perpendicular to a longitudinal direction of the cell 2 has a square shape, for example. The cell 2 may be constituted using a material such as quartz, sapphire, silicon, Kovar glass, or borosilicate glass, for example. The cell 2 allows light transmission with respect to pump light and probe light, which will be described below. The cell 2 has pump surfaces 2a and 2b, probe surfaces 2c and 2d, an upper surface 2e, a lower surface 2f, and a sealing portion 2g.

The pump surfaces 2a and 2b are a pair of end surfaces orthogonal to the first direction. An antireflection film 200 is attached to each of the pump surfaces 2a and 2b. Pump light is incident on the pump surface 2a in the first direction. The pump surface 2b emits pump light in the first direction. Pump light may be incident on and emitted from the pump surfaces 2a and 2b in directions opposite to those described above.

The probe surfaces 2c and 2d are a pair of flat surfaces orthogonal to the second direction. Probe light is incident on the probe surface 2c in the second direction. The probe surface 2d emits probe light in the second direction. Probe light may be incident on and emitted from the probe surfaces 2c and 2d in directions opposite to those described above.

The upper surface 2e and the lower surface 2f are a pair of flat surfaces orthogonal to the third direction. The heater 3 (which will be described below) and the like are attached to the upper surface 2e of the cell 2. A magnetic field generated from a measurement target is incident on the lower surface 2f of the cell 2 in a direction intersecting the measurement target.

The sealing portion 2g is an end portion provided when it is filled with an alkali metal vapor. For example, the sealing portion 2g is provided on the upper surface 2e in a region close to the pump surface 2b. The sealing portion 2g having a base end on the upper surface 2e has a shape protruding away from the upper surface 2e in the third direction and gradually reducing in diameter. In a cell substantially having a rectangular parallelepiped shape in the related art, an end portion for filling it with an alkali metal vapor is provided in a manner of protruding in the longitudinal direction of the cell. For this reason, in a cell substantially having a rectangular parallelepiped shape in the related art, a pair of end surfaces cannot be provided in the longitudinal direction of the cell. On the other hand, the sealing portion 2g according to the present embodiment is provided on the upper surface 2e. Accordingly, the pump surfaces 2a and 2b are provided as a pair of end surfaces in the longitudinal direction of the cell 2.

The cell 2 accommodates an alkali metal vapor. For example, alkali metal may be at least one or more kinds of lithium (Li), sodium (Na), potassium (K), rubidium (Rb), and cesium (Cs). For example, alkali metal may be potassium and rubidium or may be only potassium. Potassium has a comparatively low spin-destruction collision relaxation rate among the kinds of alkali metal used in an optically pumped magnetometer. For example, the spin-destruction collision relaxation rate of potassium is lower than those of cesium, rubidium, and the like. Therefore, when single alkali metal is employed, an optically pumped magnetometer using only potassium has a higher sensitivity than an optically pumped magnetometer using only cesium or only rubidium.

In addition, the cell 2 accommodates filler gas. The filler gas curbs relaxation of spin polarization of an alkali metal vapor. In addition, the filler gas protects an alkali metal vapor and curbs noise light emission. For example, the filler gas may be an inert gas such as helium (He), neon (Ne), argon (Ar), krypton (Kr), xenon (Xe), or nitrogen (N2). For example, the filler gas may be helium and nitrogen.

Returning to FIG. 1A, the heater 3 and the thermocouple 5 are attached to the cell 2. The heater 3 generates heat in accordance with a current supplied from a heater power source (not illustrated). The heater 3 controls a density of an alkali metal vapor by controlling an internal temperature of the cell 2. For example, when potassium and rubidium are accommodated as alkali metal in the cell 2, the heater 3 performs heating such that the internal temperature of the cell 2 becomes 180° C. For example, the heater 3 is attached to the upper surface 2e of the cell 2. The thermocouple 5 measures the internal temperature of the cell 2. For example, the thermocouple 5 is attached to the probe surface 2c or the probe surface 2d of the cell 2 at a position not blocking an optical path of probe light.

The optically pumped magnetometer 1 has a cell 2r having a constitution similar to that of the cell 2. The cell 2r and the cell 2 are disposed away from each other in a direction away from a measurement target (third direction). The cell 2r and the cell 2 form a first cell region and a second cell region on a measurement target. The first cell region and the second cell region correspond to regions in which the optically pumped magnetometer 1 measures a magnetic field. In the first embodiment, the first cell region is formed by the cell 2r. In addition, the second cell region is formed by the cell 2. That is, in the first embodiment, the first cell region and the second cell region are formed by multiple cells 2r and 2.

The pump laser 7 emits pump light for exciting alkali metal atoms. Alkali metal atoms accommodated in the cell 2 are excited by pump light, and spin directions thereof are aligned (spin polarization). A wavelength of pump light is set in accordance with the kind of atoms constituting an alkali metal vapor (more specifically, a wavelength of an absorption line).

When alkali metal accommodated in the cells 2 and 2r is potassium and rubidium, the pump laser 7 may emit pump light for transferring spin polarization of atoms of the rubidium to atoms of the potassium by exciting atoms of the rubidium. In this case, atoms of the rubidium are in an excited state by the pump light. Further, spin polarization of atoms of the rubidium is transferred to atoms of the potassium due to spin exchange interaction between the potassium and the rubidium, and thus atoms of the potassium are in an excited state.

The pump connector 70 is a connector for introducing pump light emitted from the pump laser 7 into a casing of the optically pumped magnetometer 1. For example, the pump connector 70 is disposed at a position close to the pump surface 2b of the cell 2r in the positive direction of the x axis.

The probe laser 8 emits probe light for detecting change in a polarization angle caused by a magnetic field in the excited state of alkali metal atoms. The probe light includes a first probe light and a second probe light. The first probe light and the second probe light may be rays of probe light divided from one ray of probe light through fiber branching or the like or may be rays of probe light emitted from multiple probe lasers 8. The probe light is influenced by the state of spin polarization of alkali metal atoms when it passes through an alkali metal vapor, and thus the polarization angle thereof changes. The state of spin polarization can be derived upon detection of this change in a polarization angle. A wavelength of probe light is set in accordance with the kind of atoms constituting an alkali metal vapor (more specifically, a wavelength of an absorption line). For example, when only potassium is accommodated as alkali metal in the cell 2, the wavelength of probe light is detuned from the wavelength of pump light (for example, 770.1 nm), that is, approximately 770 nm, for example. Due to detuning of the wavelength of probe light from the wavelength of pump light, Absorption of the probe light into the potassium is curbed.

When potassium and rubidium are accommodated as alkali metal in the cell 2, the probe laser 8 may emit probe light for detecting change in a polarization angle caused by a magnetic field in the excited state of atoms of the potassium. A density of rubidium used for excitation is set to be lower than a density of potassium used in a probe. When the density of rubidium is lower than the density of potassium, attenuation of pump light due to excitation is curbed. Accordingly, even if the cell 2 has a slender shape, pump light arrives at the pump surface 2b from the pump surface 2a or at the pump surface 2a from the pump surface 2b. As a result, pump light can uniformly excite rubidium. Thus, the optically pumped magnetometer 1 can obtain a uniform sensitivity inside the cell 2.

The probe connector 80 is a connector for introducing probe light emitted from the probe laser 8 into the casing of the optically pumped magnetometer 1.

The mirrors 10 and 11 are pump light mirrors for reflecting pump light at an angle of 90 degrees. The mirror 10 is disposed at a position close to the pump surface 2a of the cell 2r in the negative direction of the x axis. The mirror 11 is disposed at a position away from the mirror 10 in the negative direction of the z axis and close to the pump surface 2a of the cell 2.

The attenuation detection portion 20 detects attenuation of pump light having passed through the second cell region. The attenuation detection portion 20 is constituted of a photodiode. For example, the attenuation detection portion 20 is disposed at a position close to the pump surface 2b of the cell 2 in the positive direction of the x axis. The attenuation detection portion 20 generates and outputs a signal corresponding to an intensity of pump light after consecutively passing through the multiple cells 2r and 2.

The dividing portions 12 divide probe light into multiple rays. For example, the dividing portions 12 are disposed between the cell 2 and the cell 2r and are disposed side by side away from each other in the negative direction of the x axis with respect to the probe connector 80. Probe light is incident on the dividing portions 12 toward the negative direction of the x axis. The number of divided rays of probe light corresponds to the number of channels (ch) through which the optically pumped magnetometer 1 can measure a magnetic field. In addition, the number of constituents on optical paths of probe light may also vary in accordance with the number of channels. As an example, the dividing portions 12 divide probe light into four rays of probe light. In this case, the dividing portions 12 are constituted of beam splitters 12BSa, 12BSb, and 12BSc and a mirror 12M. The beam splitters 12BS a, 12BSb, and 12BSc allow some of incident light components to be transmitted therethrough and output the remaining light components from a surface different from a transmission surface. The mirror 12M reflects incident light at an angle of 90 degrees. The beam splitters 12BSa, 12BSb, and 12BSc and the mirror 12M are disposed in the negative direction of the x axis in this order.

Transmittances of the beam splitters 12BSa, 12BSb, and 12BSc are different from each other. For example, the transmittances of the beam splitters 12BSa, 12BSb, and 12BSc may be set to 75%, 66.6%, and 50%, respectively. In this case, the beam splitter 12BSa allows 75% of the incident light components to be transmitted therethrough in the negative direction of the x axis and outputs the remaining 25% in the negative direction of the y axis. The beam splitter 12BSb allows 66.6% of the light components transmitted through the beam splitter 12BSa to be transmitted in the negative direction of the x axis and outputs the remaining 33.3% in the negative direction of the y axis. The beam splitter 12BSc allows 50% of the light components transmitted through the beam splitter 12B Sb to be transmitted in the negative direction of the x axis and outputs the remaining 50% in the negative direction of the y axis. The mirror 12M reflects the light components transmitted through the beam splitter 12BSc in the negative direction of the y axis. In this manner, the dividing portions 12 divide probe light into four rays in the negative direction of the y axis. Each of the four rays of probe light has the light components of 25% of the probe light before being divided (before being guided to the dividing portions 12).

As illustrated in FIG. 1B, the optically pumped magnetometer 1 further includes mirrors 13, 14, 15, and 17, a polarization beam splitter 16, a detection portion 18, and a deriving portion 19. In FIG. 1B, the mirrors 10 and 11 are omitted.

The mirrors 13 and 14 are probe light mirrors for reflecting respective rays of probe light divided by the dividing portions 12 at an angle of 90 degrees. The mirror 13 is disposed close to the dividing portions 12 in the negative direction of the y axis. The mirror 14 is disposed away from the mirror 13 in the negative direction of the z axis and close to the probe surface 2c of the cell 2.

The mirrors 15 and 17 are probe light mirrors for reflecting respective rays of probe light having passed through the cell 2 at an angle of 90 degrees. The mirror 15 is disposed away from the mirror 14 in the positive direction of the y axis with the cell 2 sandwiched therebetween.

The polarization beam splitter 16 allows a first light component having a first polarization angle included in incident light to be transmitted therethrough and outputs a second light component having other polarization angles from a surface different from the transmission surface. For example, the first polarization angle is an angle inclined by 45 degrees with respect to the polarization angle of probe light emitted from the probe laser 8. The second light component is an angle inclined by 90 degrees with respect to the first polarization angle. Thus, when no magnetic field is applied to the cell 2, light quantities of probe light having the first and second polarization angles are equivalent to each other. In addition, when a magnetic field is applied to the cell 2, spin polarization of alkali metal atoms changes, and a polarization surface thereof changes when probe light passes through the inside of the cell 2. Therefore, the balance between the light quantities changes in accordance with the intensity of a magnetic field. The polarization beam splitter 16 is disposed away from the mirror 15 in the positive direction of the z axis.

The mirror 17 is a probe light mirror for reflecting each ray of probe light output by the polarization beam splitter 16 at an angle of 90 degrees. The mirror 17 is disposed close to the polarization beam splitter 16 in the positive direction of the y axis. The mirror 17 may be disposed close to the polarization beam splitter 16 in the positive direction of the z axis.

The detection portion 18 detects the first probe light having passed through the first cell region and the second probe light having passed through the second cell region. The detection portion 18 is constituted of a pair of photodiodes corresponding to the number of channels. The pair of photodiodes constituting the detection portion 18 are disposed respectively close to the polarization beam splitter 16 and the mirror 17 in the positive direction of the z axis. When the mirror 17 is disposed in the positive direction of the z axis with respect to the polarization beam splitter 16, the detection portion 18 may be disposed close to the polarization beam splitter 16 and the mirror 17 in the positive direction of the y axis. In the detection portion 18, the first light component and the second light component transmitted or output by the polarization beam splitter 16 are respectively incident on the pair of photodiodes. The detection portion 18 generates and outputs a signal corresponding to the intensity of the first light component and a signal corresponding to the intensity of the second light component.

The optically pumped magnetometer 1 further includes mirrors 13r, 14r, 15r, and 17r, a polarization beam splitter 16r, and a detection portion 18r. These constituents respectively have functions similar to those of the mirrors 13, 14, 15, and 17, the polarization beam splitter 16, and the detection portion 18 described above.

The mirror 13r is disposed close to the dividing portions 12 in the negative direction of the y axis. The mirror 14r is disposed away from the mirror 13r in the positive direction of the z axis and close to the probe surface 2c of the cell 2r. The mirror 15r is disposed away from the mirror 14r in the positive direction of the y axis with the cell 2r sandwiched therebetween. The polarization beam splitter 16r is disposed away from the mirror 15r in the positive direction of the z axis. The mirror 17r is disposed close to the polarization beam splitter 16r in the negative direction of the y axis. The mirror 17r may be disposed close to the polarization beam splitter 16r in the positive direction of the z axis. The pair of photodiodes constituting the detection portion 18r are disposed respectively close to the polarization beam splitter 16r and the mirror 17r in the positive direction of the z axis. When the mirror 17r is disposed in the positive direction of the z axis with respect to the polarization beam splitter 16r, the detection portion 18r may be disposed close to the polarization beam splitter 16r and the mirror 17r in the negative direction of the y axis.

The deriving portion 19 acquires an output signal from the detection portions 18 and 18r and the attenuation detection portion 20. The deriving portion 19 derives the intensity of a magnetic field related to a region having pump light and the first probe light orthogonal to each other from change in a polarization angle of the first probe light within the first cell region based on detection results of the detection portion 18r. The deriving portion 19 derives the intensity of a magnetic field related to a region having pump light having passed through the first cell region and the second probe light orthogonal to each other from change in a polarization angle of the second probe light within the second cell region based on detection results of the detection portion 18.

The deriving portion 19 performs noise removal processing by calculating a difference between the intensity of a magnetic field related to an area within the first cell region and the intensity of a magnetic field related to an area within the second cell region. Such an optically pumped magnetometer 1 is constituted as a first derivation axis-type gradiometer.

The deriving portion 19 revises at least one of the intensity of a magnetic field related to an area within the first cell region and the intensity of a magnetic field related to an area within the second cell region based on detection results of the attenuation detection portion 20. For example, the deriving portion 19 derives attenuation of pump light having passed through the cell 2 based on detection results of the attenuation detection portion 20. As an example, the deriving portion 19 derives attenuation of pump light, for example, based on a signal intensity of pump light output from the pump laser 7 and a signal intensity of pump light detected by the attenuation detection portion 20. The deriving portion 19 revises at least one of the intensity of a magnetic field related to an area within the first cell region and the intensity of a magnetic field related to an area within the second cell region using the derived attenuation of the pump light and a predetermined function.

The deriving portion 19 is physically constituted to include a memory such as a RAM or a ROM, a processor (arithmetic circuit) such as a CPU, a communication interface, and a storage portion such as a hard disk. Examples of the deriving portion 19 include a personal computer, a cloud server, a smartphone, and a tablet terminal. The deriving portion 19 functions when a program stored in the memory is executed by the CPU in a computer system.

Figure 3A:
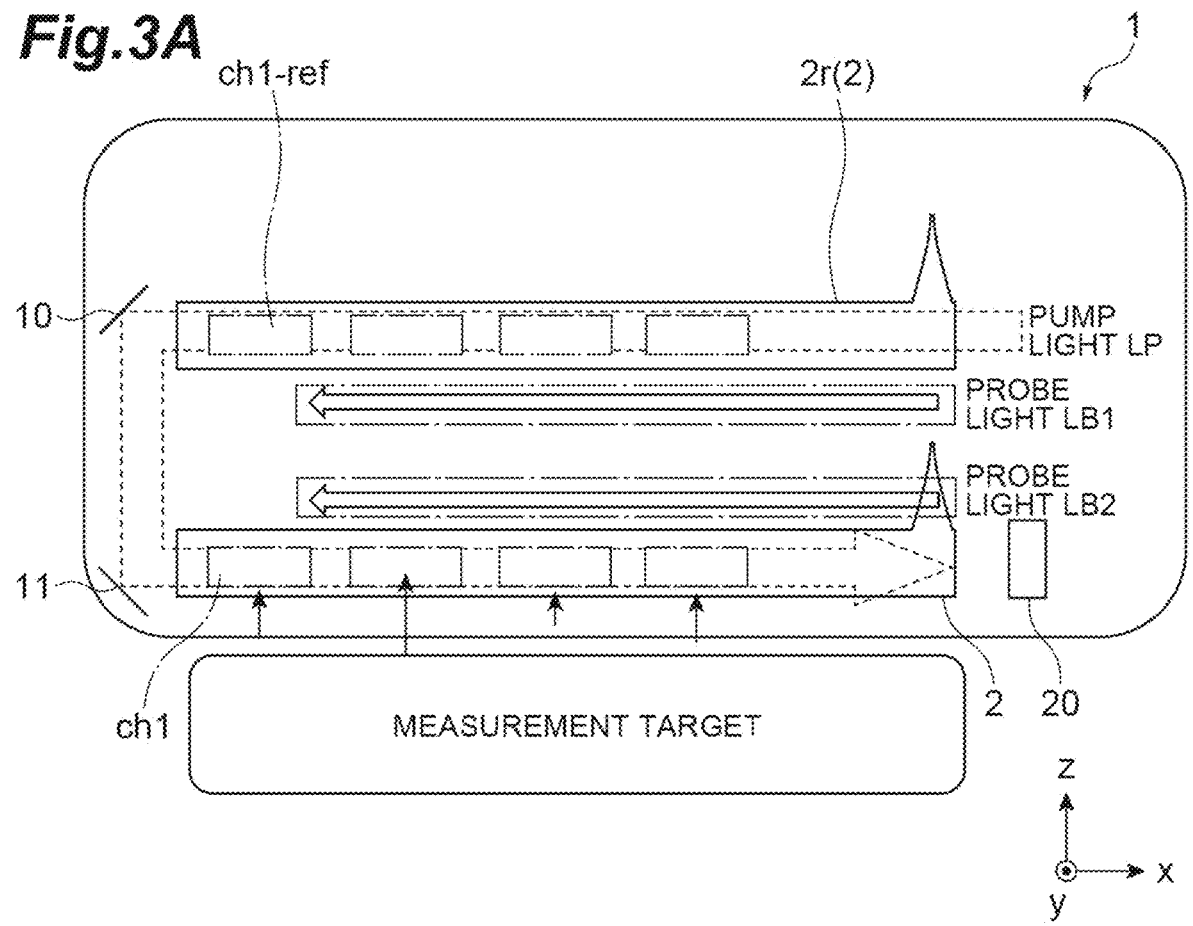
FIGS. 3A and 3B are schematic views illustrating optical paths of pump light and probe light according to the first embodiment.
Figure 3B:
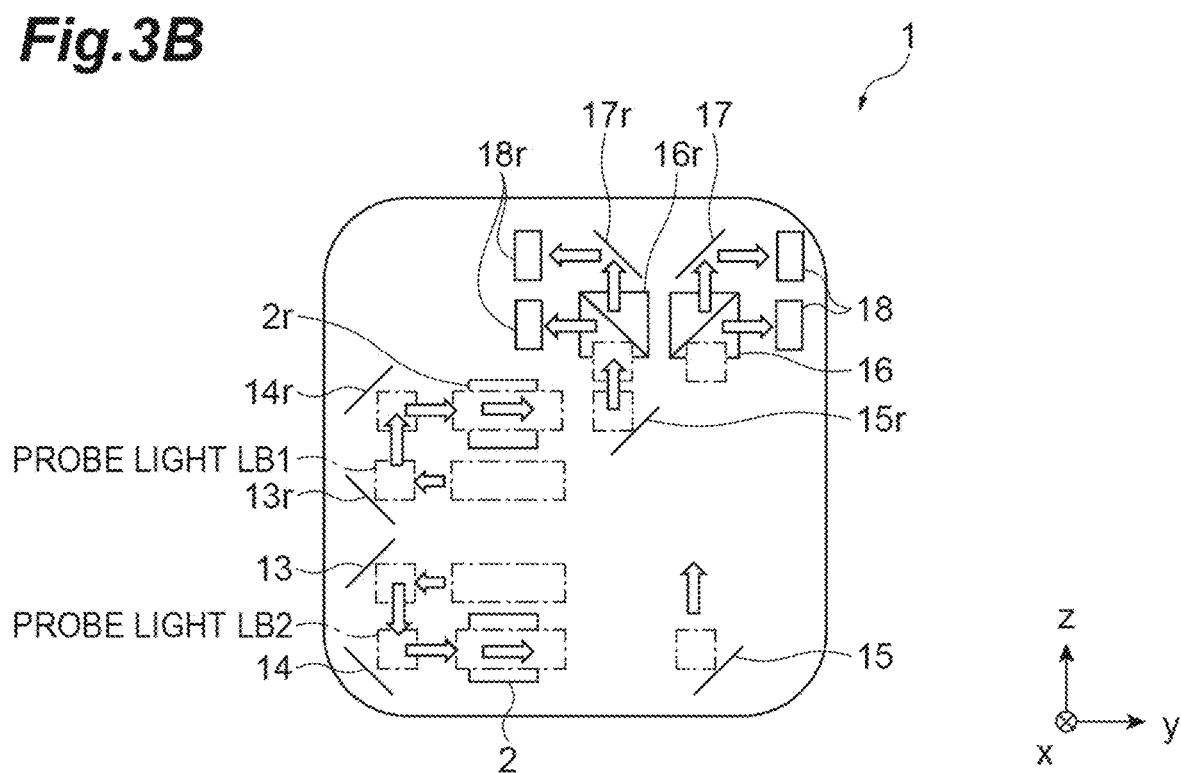

FIG. 3A and FIG. 3B are schematic views illustrating optical paths of pump light and probe light according to the first embodiment. FIG. 3A and FIG. 3B illustrate a simplified constitution of the optically pumped magnetometer 1. First, optical paths of pump light will be described with reference to FIG. 3A. FIG. 3A is a view of the optically pumped magnetometer 1 viewed from a side. FIG. 3A illustrates that a magnetic field has been generated from a measurement target in the positive direction of the z axis.

Pump light LP is introduced into the casing of the optically pumped magnetometer 1 by the pump connector 70 and is emitted in the negative direction of the x axis. The pump light LP is incident on the pump surface 2b of the cell 2r in the negative direction of the x axis. In this manner, the pump connector 70 functions as a first optical system for causing the pump light LP to be incident on the first cell region in the first direction.

The pump light LP passes through the inside of the cell 2r in the negative direction of the x axis. The pump light LP is emitted from the pump surface 2a of the cell 2r. The mirror 10 reflects the pump light LP having passed through the cell 2r in the negative direction of the z axis. Subsequently, the mirror 11 reflects the pump light LP reflected by the mirror 10 in the positive direction of the x axis. The pump light LP is incident on the pump surface 2a of the cell 2 in the positive direction of the x axis. In this manner, the mirrors 10 and 11 function as a second optical system for causing pump light having passed through the first cell region to be incident on the second cell region in the first direction. In addition, the mirrors 10 and 11 cause pump light having passed through the first cell region to be turned back and be incident on the second cell region.

The pump light LP passes through the inside of the cell 2 in the positive direction of the x axis. The pump light LP is emitted from the pump surface 2b of the cell 2. The pump light LP having passed through the cell 2 is incident on the attenuation detection portion 20.

Next, optical paths of probe light will be described. Probe light LB1 and probe light LB2 are introduced into the casing of the optically pumped magnetometer 1 by the probe connector 80 and are emitted in the negative direction of the x axis. Each of the probe light LB1 and the probe light LB2 is divided into four rays of probe light by the dividing portions 12, thereby being emitted in the negative direction of the y axis. Hereinafter, in the description of FIG. 3A and FIG. 3B, it is assumed that the probe light LB1 is divided into four rays and the probe light LB2 is also divided into four rays.

FIG. 3B is a view of the optically pumped magnetometer 1 viewed from the front. In FIG. 3B, illustration of the pump light LP is omitted. The mirror 13r reflects the probe light LB1 output from the dividing portions 12 in the positive direction of the z axis. The mirror 14r reflects the probe light LB1 reflected by the mirror 13r in the positive direction of the y axis. The probe light LB1 is incident on the probe surface 2c of the cell 2r in the positive direction of the y axis. In this manner, the dividing portions 12 and the mirrors 13r and 14r function as a third optical system for causing the first probe light to be incident on the first cell region in the second direction orthogonal to the first direction.

The probe light LB1 passes through the inside of the cell 2r in the positive direction of the y axis. The probe light LB1 is emitted from the probe surface 2d of the cell 2r. The mirror 15r reflects the probe light LB1 having passed through the cell 2r in the positive direction of the z axis. The polarization beam splitter 16r allows the first light component of the probe light LB1 reflected by the mirror 15r to be transmitted therethrough in the positive direction of the z axis and outputs the second light component in the negative direction of the y axis. The mirror 17r reflects the first light component of the probe light LB1 transmitted through the polarization beam splitter 16r in the negative direction of the y axis. The first light component and the second light component of the probe light LB1 are respectively incident on the pair of photodiodes of the detection portion 18r.

The mirror 13 reflects the probe light LB2 output from the dividing portions 12 in the negative direction of the z axis. The mirror 14 reflects the probe light LB2 reflected by the mirror 13 in the positive direction of the y axis. The probe light LB2 is incident on the probe surface 2c of the cell 2 in the positive direction of the y axis. In this manner, the dividing portions 12 and the mirrors 13 and 14 function as a fourth optical system for causing the second probe light to be incident on the second cell region in the second direction.

The probe light LB2 passes through the inside of the cell 2 in the positive direction of the y axis. The probe light LB2 is emitted from the probe surface 2d of the cell 2. The mirror 15 reflects the probe light LB2 having passed through the cell 2 in the positive direction of the z axis. The polarization beam splitter 16 allows the first light component of the probe light LB2 reflected by the mirror 15 to be transmitted therethrough in the positive direction of the z axis and outputs the second light component in the positive direction of the y axis. The mirror 17 reflects the first light component of the probe light LB2 transmitted through the polarization beam splitter 16 in the positive direction of the y axis. The first light component and the second light component of the probe light LB2 are respectively incident on the pair of photodiodes of the detection portion 18.

In this manner, the pump light LP proceeds in the negative direction of the x axis (first direction) in the first cell region. The probe light LB1 proceeds in the positive direction of the y axis (second direction) in the first cell region. The pump light LP in the first direction and the probe light LB1 in the second direction are orthogonal to each other in the first cell region. As a result, a reference region is formed in each of the channels in the first derivation axis-type gradiometer.

In addition, the pump light LP proceeds in the positive direction of the x axis (first direction) in the second cell region. The probe light LB2 proceeds in the positive direction of the y axis (second direction) in the second cell region. The pump light LP in the first direction and the probe light LB2 in the second direction are orthogonal to each other in the second cell region. As a result, a measurement region is formed in each of the channels in the first derivation axis-type gradiometer.

As illustrated in FIG. 3A, a first reference region ch1-ref is formed in the first cell region. In addition, a first measurement region ch1 is formed in the second cell region. The first reference region ch1-ref and the first measurement region ch1 are away from each other in the third direction. The first measurement region ch1 is closer to a measurement target than the first reference region ch1-ref. For this reason, the first measurement region ch1 can have a higher sensitivity for a magnetic field generated from a measurement target. Here, both the first reference region ch1-ref and the first measurement region ch1 may receive an influence of common-mode noise. In the first derivation axis-type gradiometer, an influence of common-mode noise can be canceled by calculating a difference between the intensity of a magnetic field related to the first reference region ch1-ref and the intensity of a magnetic field related to the first measurement region ch1.

As described above, the optically pumped magnetometer 1 according to the first embodiment includes at least one cell 2 configured to be filled with an alkali metal vapor, be disposed in the first direction along a measurement target, and form the first cell region and the second cell region on a measurement target; the pump laser 7 configured to emit pump light for exciting alkali metal atoms; the probe laser 8 configured to emit probe light including the first probe light and the second probe light for detecting change in a polarization angle caused by a magnetic field in the excited state of alkali metal atoms; the first optical system configured to cause pump light to be incident on the first cell region in the first direction; the second optical system configured to cause pump light having passed through the first cell region to be incident on the second cell region in the first direction; the third optical system configured to cause the first probe light to be incident on the first cell region in the second direction orthogonal to the first direction; the fourth optical system configured to cause the second probe light to be incident on the second cell region in the second direction; the detection portions 18 and 18r configured to detect the first probe light having passed through the first cell region, and the second probe light having passed through the second cell region; and the deriving portion 19 configured to derive the intensity of a magnetic field related to a region having pump light and the first probe light orthogonal to each other from change in a polarization angle of the first probe light within the first cell region and derive the intensity of a magnetic field related to a region having pump light having passed through the first cell region and the second probe light orthogonal to each other from change in a polarization angle of the second probe light within the second cell region based on detection results of the detection portions 18 and 18r.

In this optically pumped magnetometer 1, pump light is incident on the first cell region in the first direction, and the first probe light is incident on the first cell region in the second direction. Traveling directions of pump light and the first probe light are orthogonal to each other within the first cell region. Further, pump light having passed through the first cell region is incident on the second cell region in the first direction, and the second probe light is incident on the second cell region in the second direction. Traveling directions of pump light having passed through the first cell region and the second probe light are orthogonal to each other within the second cell region. That is, the same pump light is consecutively incident throughout multiple cell regions. Further, the intensity of a magnetic field related to a region having them intersecting each other is derived using pump light and the first probe light, and the intensity of a magnetic field related to a region having them intersecting each other is derived using pump light and the second probe light. Accordingly, there is no need to cause pump light to branch or prepare multiple pump lasers 7 in a manner of corresponding to the number of cell regions. Therefore, the constitution related to pump light can be simplified. Accordingly, it is possible to provide the optically pumped magnetometer 1 which can be miniaturized.

The first cell region and the second cell region are formed by the multiple cells 2r and 2. Accordingly, each of the cells 2r and 2 can be miniaturized.

The multiple cells 2r and 2 are disposed away from each other in a direction away from a measurement target. The deriving portion 19 performs noise removal processing by calculating a difference between the intensity of a magnetic field related to an area within the first cell region and the intensity of a magnetic field related to an area within the second cell region. According to such a constitution, since an influence of common-mode noise is manifested in each of the intensity of a magnetic field related to an area within the first cell region and the intensity of a magnetic field related to an area within the second cell region, common-mode noise is removed by calculating the difference therebetween. Accordingly, measurement accuracy of the optically pumped magnetometer 1 can be improved.

At least one cell 2 has the pair of pump surfaces 2a and 2b in the first direction with the antireflection films 200 attached to the pump surfaces 2a and 2b. According to such a constitution, when pump light is incident on and emitted from the first cell region or the second cell region in the first direction, attenuation due to reflection of pump light is curbed. Accordingly, electric power of the pump laser 7 can be reduced.

The present embodiment further includes the attenuation detection portion 20 configured to detect attenuation of pump light having passed through the second cell region. The deriving portion 19 revises at least one of the intensity of a magnetic field related to an area within the first cell region and the intensity of a magnetic field related to an area within the second cell region based on detection results of the attenuation detection portion 20. According to such a constitution, attenuation of pump light is taken into consideration, and the intensity of a magnetic field related to an area within each cell region is revised. Accordingly, measurement accuracy of the optically pumped magnetometer 1 can be improved.

In the present embodiment, alkali metal accommodated in the cell 2 is potassium and rubidium. The density of rubidium is lower than the density of potassium. The pump laser 7 emits pump light for exciting atoms of rubidium and transferring spin polarization of atoms of rubidium to atoms of potassium. The probe laser 8 emits probe light for detecting change in a polarization angle caused by a magnetic field in the excited state of atoms of potassium. According to such a constitution, if pump light excites atoms of rubidium, spin polarization of atoms of rubidium is transferred to atoms of potassium, and thus atoms of potassium are excited. This phenomenon is caused due to spin exchange interaction between potassium and rubidium. Since pump light excites rubidium having a lower density, attenuation of pump light is curbed. As a result, electric power of the pump laser 7 can be reduced.

In the present embodiment, the second optical system causes pump light having passed through the first cell region to be turned back and be incident on the second cell region. In this case, since a short optical path can be set for pump light, it is possible to provide the optically pumped magnetometer 1 which can be miniaturized.

Second Embodiment

Figure 4:
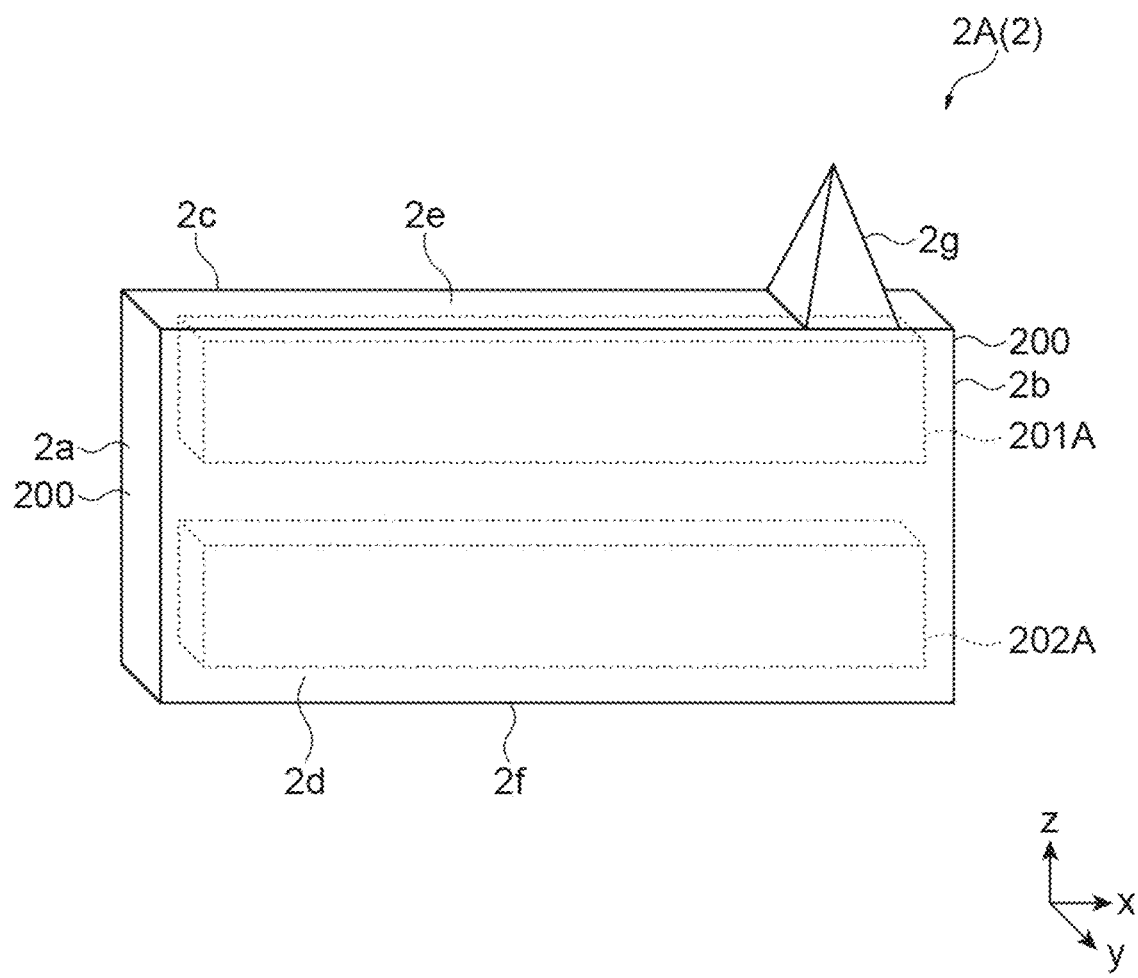
FIG. 4 is a perspective view illustrating an example of a cell according to a second embodiment.
Figure 5A:
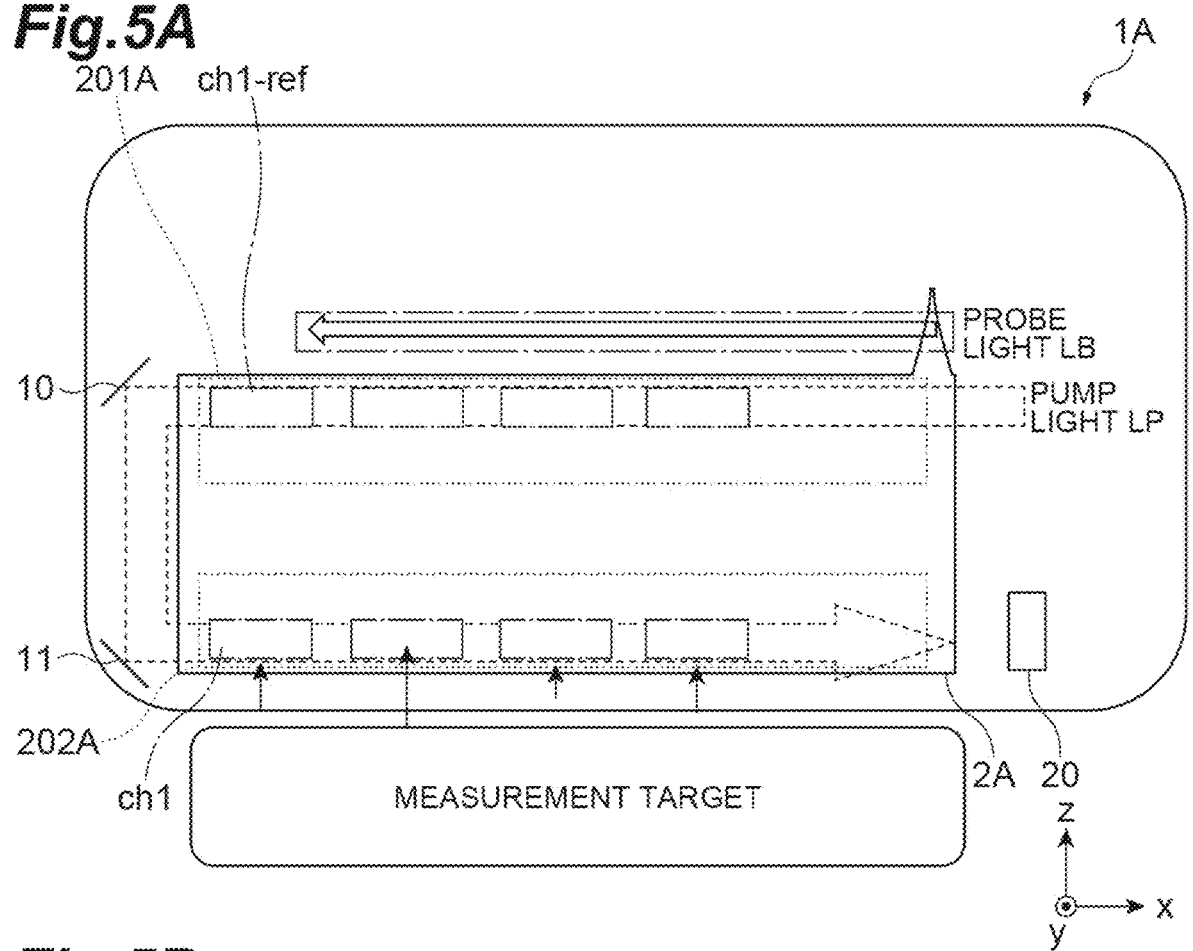
FIGS. 5A and 5B are schematic views illustrating optical paths of pump light and probe light according to the second embodiment.
Figure 5B:
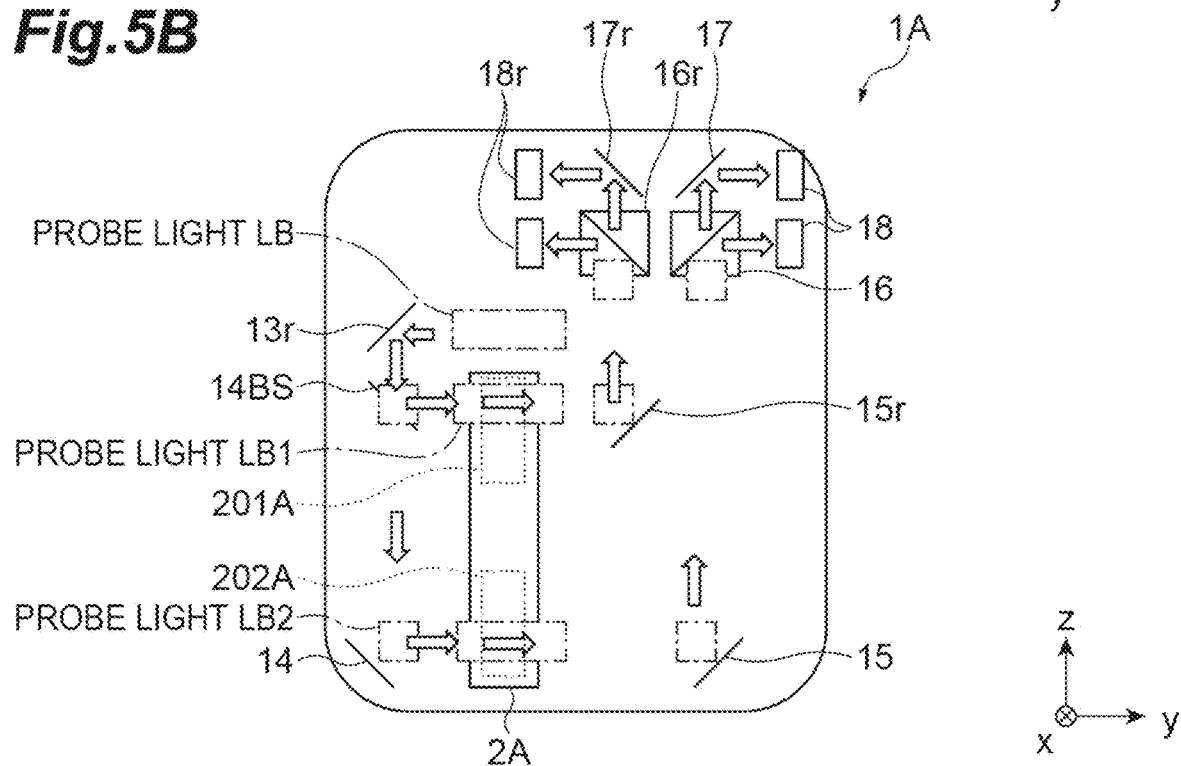

With reference to FIGS. 4, 5A and 5B, an optically pumped magnetometer 1A according to a second embodiment will be described. The optically pumped magnetometer 1A differs from the optically pumped magnetometer 1 according to the first embodiment in that the first cell region and the second cell region are formed by one cell 2A.

FIG. 4 is a perspective view illustrating an example of the cell 2A according to the second embodiment. The cell 2A has a function similar to that of the cell 2 according to the first embodiment but has a different shape. The cell 2A substantially has a rectangular parallelepiped bottomed tubular shape. A cross section of the cell 2 in a direction perpendicular to the longitudinal direction of the cell 2A has a rectangular shape, for example. The cell 2A is formed to further extend in the third direction than the cell 2. The cell 2A has a first space 201A and a second space 202A which are virtually stipulated spaces. The first space 201A and the second space 202A are away from each other in a direction away from a measurement target. The first space 201A forms the first cell region. The second space 202A forms the second cell region. That is, in the second embodiment, the first cell region and the second cell region are away from each other in a direction away from a measurement target and are formed by one cell 2A.

FIG. 5A and FIG. 5B are schematic views illustrating optical paths of pump light and probe light according to the second embodiment. FIG. 5A and FIG. 5B illustrate a simplified constitution of the optically pumped magnetometer 1A. First, optical paths of pump light will be described with reference to FIG. 5A. FIG. 5A is a view of the optically pumped magnetometer 1A viewed from a side. FIG. 5A illustrates that a magnetic field has been generated from a measurement target in the positive direction of the z axis.

The pump light LP is introduced into the casing of the optically pumped magnetometer 1A by the pump connector 70 and is emitted in the negative direction of the x axis. The pump light LP is incident on the pump surface 2b of the cell 2A in the negative direction of the x axis.

The pump light LP passes through the first space 201A of the cell 2A in the negative direction of the x axis. The pump light LP is emitted from the pump surface 2a of the cell 2A. The mirror 10 reflects the pump light LP having passed through the first space 201A of the cell 2A in the negative direction of the z axis. Subsequently, the mirror 11 reflects the pump light LP reflected by the mirror 10 in the positive direction of the x axis. The pump light LP is incident on the pump surface 2a of the cell 2A in the positive direction of the x axis.

The pump light LP passes through the second space 202A of the cell 2 in the positive direction of the x axis. The pump light LP is emitted from the pump surface 2b of the cell 2A. The pump light LP having passed through the cell 2A is incident on the attenuation detection portion 20.

Next, optical paths of probe light will be described. Probe light LB is introduced into the casing of the optically pumped magnetometer 1A by the probe connector 80 and is emitted in the negative direction of the x axis. The probe light LB is individually divided into four rays of probe light by the dividing portions 12, thereby being emitted in the negative direction of the y axis. Hereinafter, in the description of FIG. 5A and FIG. 5B, it is assumed that the probe light LB is divided into four rays.

FIG. 5B is a view of the optically pumped magnetometer 1A viewed from the front. In FIG. 5B, illustration of the pump light LP is omitted. As illustrated in FIG. 5B, the optically pumped magnetometer 1A includes a beam splitter 14BS. The beam splitter 14BS is disposed close to the mirror 13r in the negative direction of the z axis.

The mirror 13r reflects the probe light LB output from the dividing portions 12 in the negative direction of the z axis. The beam splitter 14BS outputs 50% of the probe light LB reflected by the mirror 13r as the probe light LB1 in the negative direction of the y axis and allows the remaining 50% to be transmitted therethrough as the probe light LB2 in the negative direction of the z axis. The probe light LB1 is incident on the probe surface 2c of the cell 2A in the positive direction of the y axis. In this manner, the dividing portions 12, the mirror 13r, and the beam splitter 14B S function as the third optical system for causing the first probe light to be incident on the first cell region in the second direction orthogonal to the first direction.

The mirror 14 reflects the probe light LB2 output by the beam splitter 14BS in the positive direction of the y axis. The probe light LB2 is incident on the probe surface 2c of the cell 2 in the positive direction of the y axis. In this manner, the dividing portions 12, the mirror 13r, the beam splitter 14BS, and the mirror 14 function as the fourth optical system for causing the second probe light to be incident on the second cell region in the second direction.

The probe light LB1 passes through the first space 201A of the cell 2A in the positive direction of the y axis. The probe light LB2 passes through the second space 202A of the cell 2A in the positive direction of the y axis. The probe light LB1 and the probe light LB2 are emitted from the probe surface 2d of the cell 2A. The optical paths of the probe light LB1 and the probe light LB2 after having passed through cell 2A are similar to the optical paths of the probe light LB1 and the probe light LB2 in the optically pumped magnetometer 1 according to the first embodiment.

In this manner, the pump light LP in the first direction and the probe light LB1 in the second direction are orthogonal to each other in the first space 201A (first cell region) of the cell 2A. As a result, the reference region of each of the channels in the first derivation axis-type gradiometer is formed. As an example, as illustrated in FIG. 5A, the first reference region ch1-ref is formed in the first cell region.

In addition, the pump light LP in the first direction and the probe light LB2 in the second direction are orthogonal to each other in the second space 202A (second cell region) of the cell 2A. As a result, the measurement region of each of the channels in the first derivation axis-type gradiometer is formed. As an example, the first measurement region ch1 is formed in the second cell region.

As described above, the optically pumped magnetometer 1A according to the second embodiment includes the cell 2A. The first cell region and the second cell region are away from each other in a direction away from a measurement target and are formed by one cell 2A. The deriving portion 19 performs noise removal processing by calculating a difference between the intensity of a magnetic field related to an area within the first cell region and the intensity of a magnetic field related to an area within the second cell region. Accordingly, the cell 2A can have a simple constitution. In addition, since common-mode noise is removed, measurement accuracy of the optically pumped magnetometer 1A can be improved.

Third Embodiment with reference to FIG. 6, an optically pumped magnetometer 1B according to a third embodiment will be described. The optically pumped magnetometer 1B differs from the optically pumped magnetometer 1 according to the first embodiment in that multiple cells forming the first cell region and the second cell region are disposed away from each other in the second direction.

Figure 6:
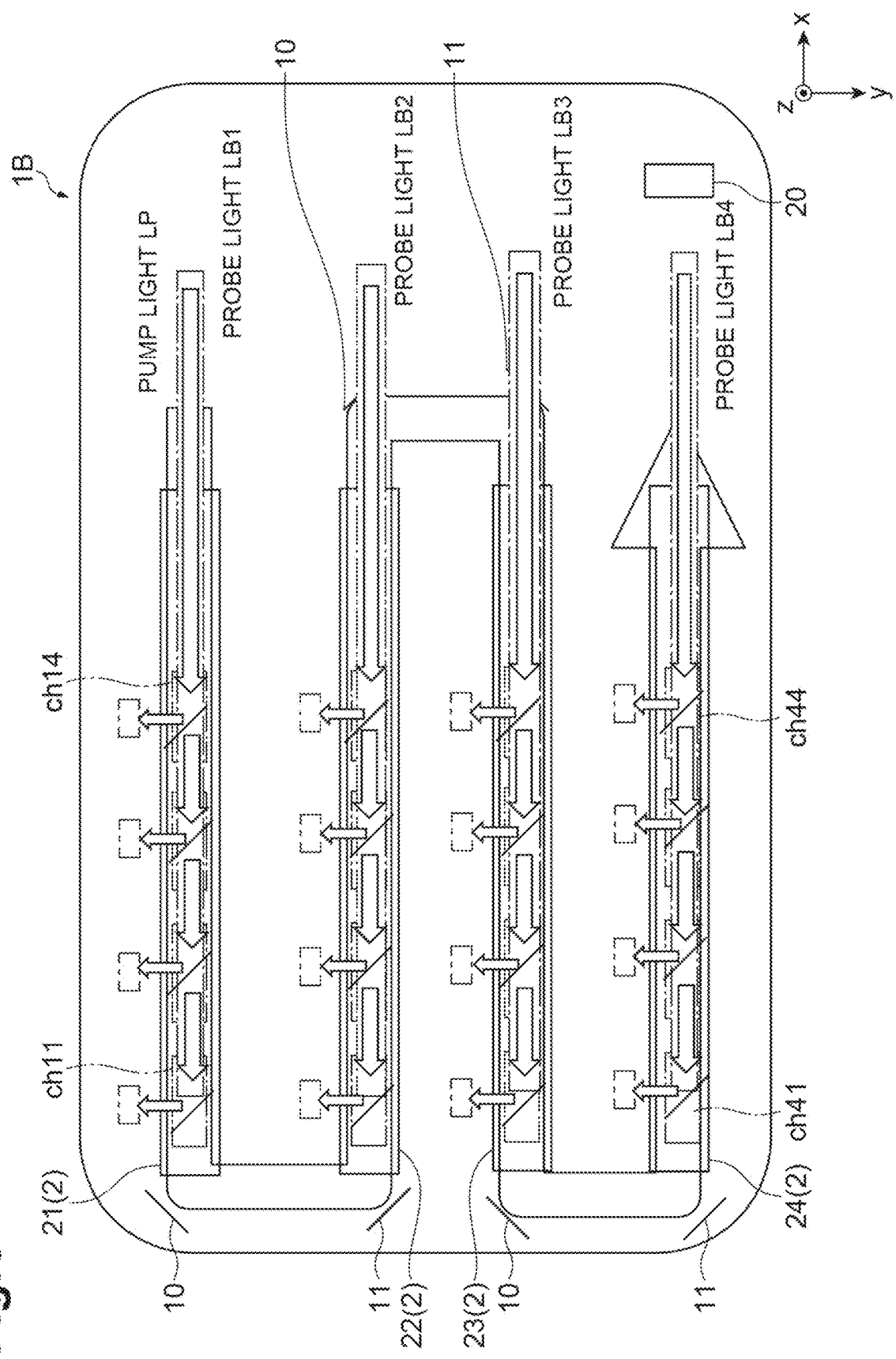
FIG. 6 is a schematic view illustrating optical paths of the pump light and the probe light according to a third embodiment.

FIG. 6 is a schematic view illustrating optical paths of pump light and probe light according to the third embodiment. FIG. 6 is a view of the optically pumped magnetometer 1A viewed from above. FIG. 6 illustrates a simplified constitution of the optically pumped magnetometer 1B.

The optically pumped magnetometer 1B includes cells 21, 22, 23, and 24 having constitutions similar to that of the cell 2 according to the first embodiment. The cells 21, 22, 23, and 24 are disposed away from each other in the positive direction of the y axis in this order. That is, the multiple cells are disposed away from each other in a direction orthogonal to the first direction and extending along a measurement target (second direction). In the third embodiment, the first cell region and the second cell region are formed by a pair of cells which are disposed in order. For example, the cell 21 forms the first cell region, and the cell 22 forms the second cell region. In addition, the cell 22 forms the first cell region, and the cell 23 forms the second cell region. In this manner, when there are three or more cells, the first cell region and the second cell region may be formed with two cells constituted as a pair.

The pump light LP is introduced into the casing of the optically pumped magnetometer 1B by the pump connector 70 and is emitted in the negative direction of the x axis. The pump light LP is incident on the pump surface 2b of the cell 21 in the negative direction of the x axis.

The pump light LP passes through the inside of the cell 21 in the negative direction of the x axis. The pump light LP is emitted from the pump surface 2a of the cell 21. The mirror 10 reflects the pump light LP having passed through the cell 21 in the positive direction of the y axis. Subsequently, the mirror 11 reflects the pump light LP reflected by the mirror 10 in the positive direction of the x axis. The pump light LP is incident on the pump surface 2a of the cell 22 in the positive direction of the x axis.

The pump light LP passes through the inside of in the positive direction of the x axis the cell 22. The pump light LP is emitted from the pump surface 2b of the cell 22. The mirror 10 reflects the pump light LP having passed through the cell 22 in the positive direction of the y axis. Subsequently, the mirror 11 reflects the pump light LP reflected by the mirror 10 in the negative direction of the x axis. The pump light LP is incident on the pump surface 2b of the cell 23 in the negative direction of the x axis.

Similar to the optical paths in the cell 21 and the cell 22 described above, the pump light LP passes through the cell 23 and the cell 24. The pump light LP having passed through the cell 24 is incident on the attenuation detection portion 20.

The probe laser 8 may emit probe light including the probe light LB1, the probe light LB2, probe light LB3, and probe light LB4. The probe laser 8 may divide emitted probe light into the probe light LB1, the probe light LB2, the probe light LB3, and the probe light LB4 through fiber branching or the like. Alternatively, the optically pumped magnetometer 1B may include multiple probe lasers 8. The probe light LB1, the probe light LB2, the probe light LB3, and the probe light LB4 are introduced into the casing of the optically pumped magnetometer 1A by the probe connector 80 and are individually emitted in the negative direction of the x axis. Each of the probe light LB1, the probe light LB2, the probe light LB3, and the probe light LB4 is divided into four rays of probe light by the dividing portions 12, thereby being emitted in the negative direction of the y axis. Hereinafter, in the description of FIG. 6, it is assumed that each of the probe light LB1, the probe light LB2, the probe light LB3, and the probe light LB4 is divided into four rays. The probe light LB1, the probe light LB2, the probe light LB3, and the probe light LB4 are respectively guided into the cells 21, 22, 23, and 24 by the mirrors 13 and 14 (refer to FIG. 3B).

In this manner, the pump light LP in the first direction and the probe light LB1 in the second direction are orthogonal to each other in the cell 21. The pump light LP in the first direction and the probe light LB2 in the second direction are orthogonal to each other in the cell 22. The pump light LP in the first direction and the probe light LB3 in the second direction are orthogonal to each other in the cell 23. The pump light LP in the first direction and the probe light LB4 in the second direction are orthogonal to each other in the cell 24. As a result, the measurement region of each of the channels is formed. As an example, a first measurement region ch11 is formed inside the cell 21 disposed first in order. In addition, a measurement region ch14 of a fourth channel is formed inside the cell 21. Similarly, a first measurement region ch41 is formed inside the cell 24 disposed fourth in order. In addition, a measurement region ch44 of a fourth channel is formed inside the cell 24.

As described above, the optically pumped magnetometer 1B according to the third embodiment includes the cells 21, 22, 23, and 24. The multiple cells 21, 22, 23, and 24 may be disposed away from each other in a direction orthogonal to the first direction and extending along a measurement target. According to such a constitution, the cells 21, 22, 23, and 24 are adjacent to each other in a horizontal direction along a measurement target. Since the same pump light LP is incident on cells adjacent to each other, there is no need to prepare a constitution related to pump light for each cell. In this case, since an interval between cells adjacent to each other can be narrowed, the optically pumped magnetometer 1B can be miniaturized.

Modification Example

The present disclosure is not limited to the embodiments described above, and various modifications can be made as described below within a range not departing from the gist of the present disclosure.

Figure 7A:
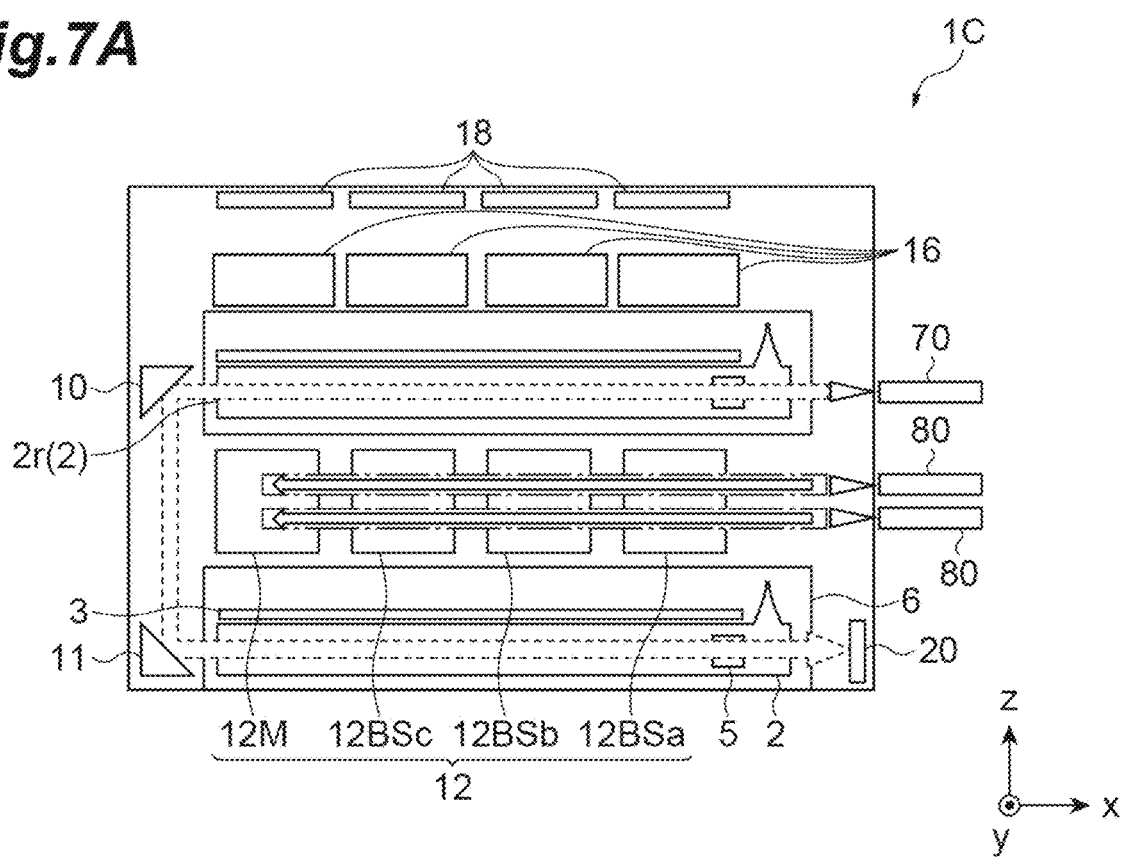
FIGS. 7A and 7B are views illustrating a constitution of an optically pumped magnetometer according to a first modification example.
Figure 7B:
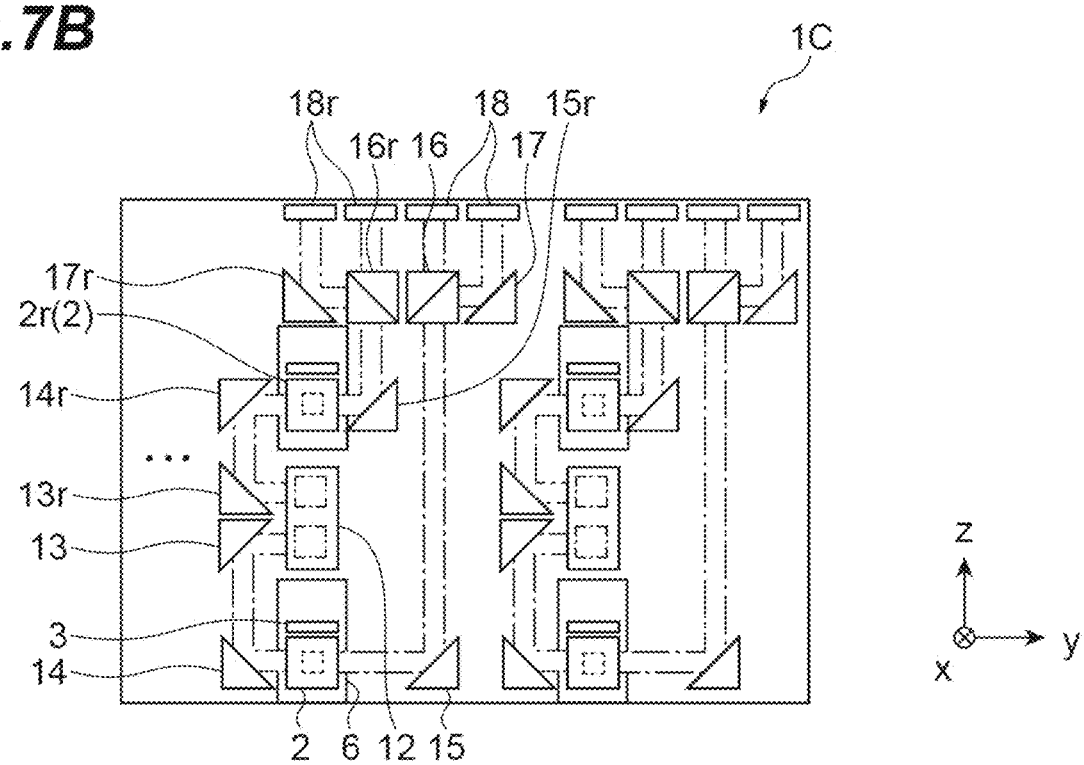

FIG. 7A and FIG. 7B are views illustrating a constitution of an optically pumped magnetometer 1C according to a first modification example. FIG. 7A is a view illustrating a constitution of the optically pumped magnetometer 1C when viewed from a side. FIG. 7B is a view illustrating a constitution of the optically pumped magnetometer 1C when viewed from the front. The optically pumped magnetometer 1C has four sets of 4 ch optically pumped magnetometers 1 inside one casing. That is, the optically pumped magnetometer 1C derives magnetic fields corresponding to 16 channels in total. In FIG. 7A and FIG. 7B, illustration of the pump laser 7, the probe laser 8, and the deriving portion 19 is omitted.

The optical paths of pump light and probe light in the optically pumped magnetometer 1C are similar to the optical paths of pump light and probe light in the optically pumped magnetometer 1 described above (refer to FIG. 3A and FIG. 3B). With this optically pumped magnetometer 1C as well, there is no need to cause pump light to branch or prepare multiple pump lasers 7 in a manner of corresponding to the number of cell regions. Therefore, the constitution related to pump light can be simplified. Accordingly, it is possible to provide the optically pumped magnetometer 1C which can be miniaturized.

Figure 8A:
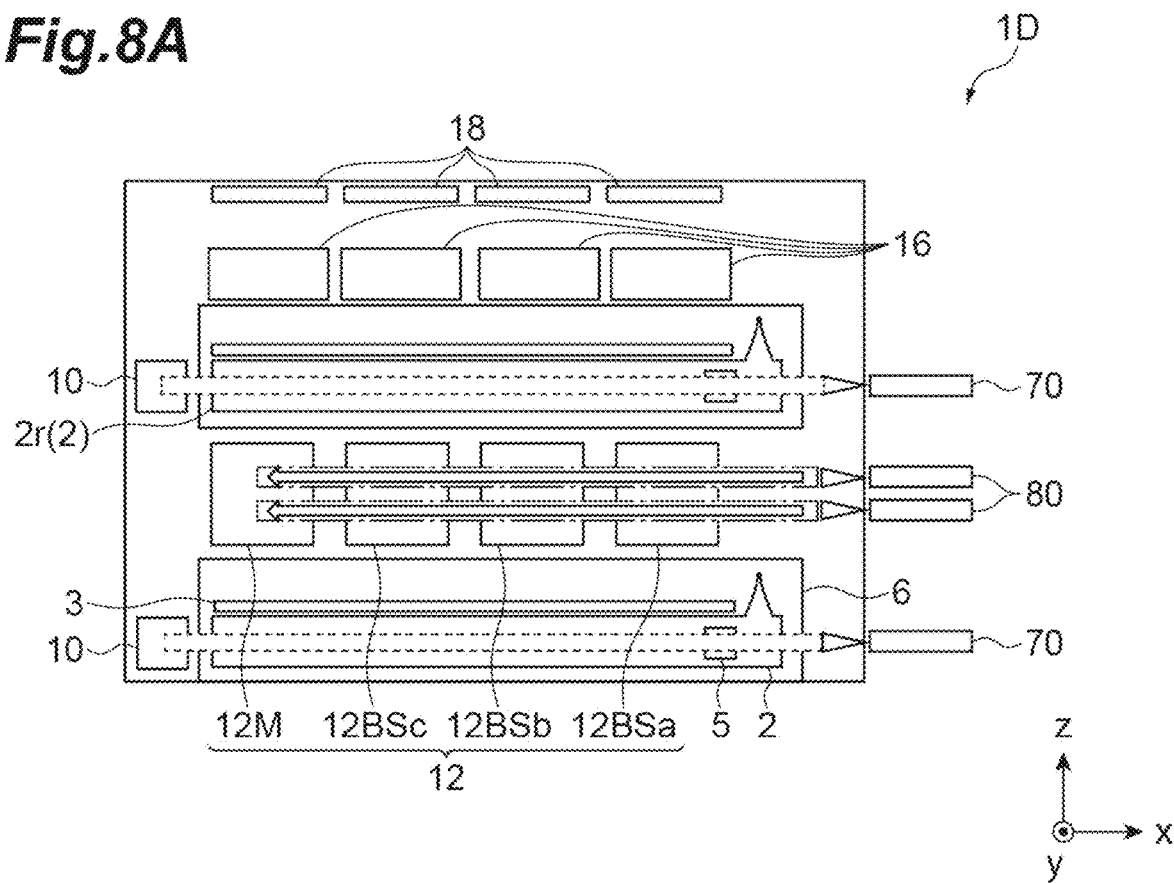
FIGS. 8A and 8B are views illustrating a constitution of an optically pumped magnetometer according to a second modification example.
Figure 8B:
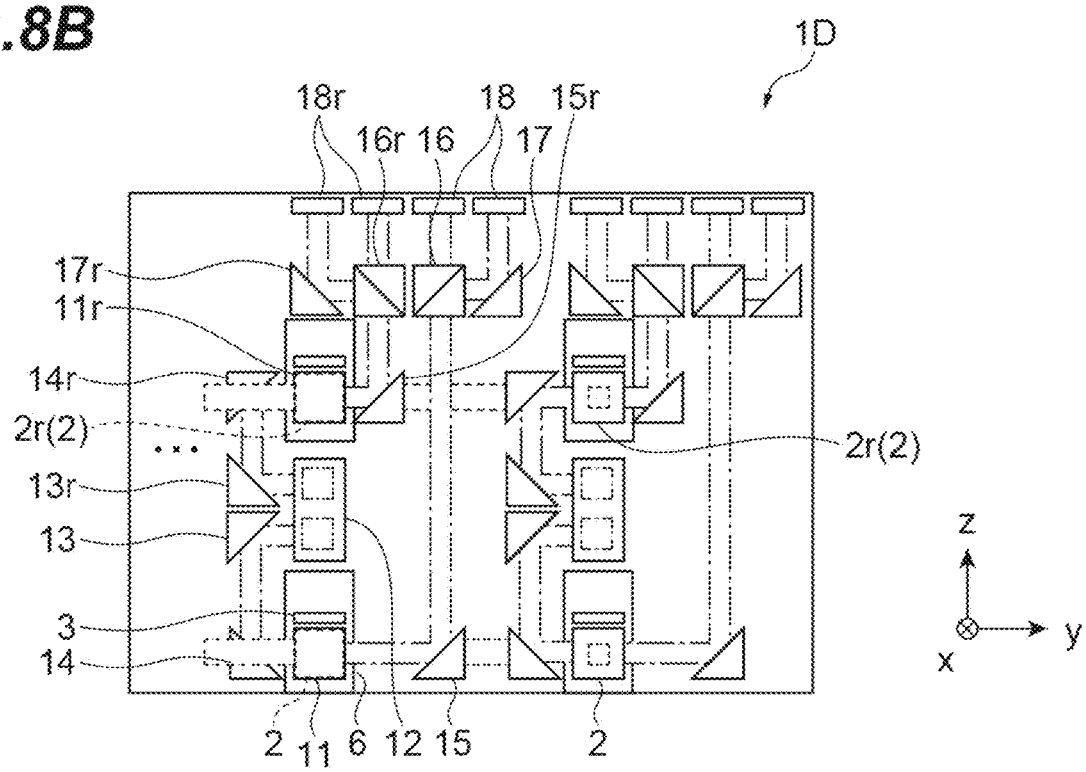

FIG. 8A and FIG. 8B are views illustrating a constitution of an optically pumped magnetometer 1D according to a second modification example. FIG. 8A is a view illustrating a constitution of the optically pumped magnetometer 1D when viewed from a side. FIG. 8B is a view illustrating a constitution of the optically pumped magnetometer 1D when viewed from the front. As illustrated in FIG. 8A, the optically pumped magnetometer 1D differs from the optically pumped magnetometer 1C in a disposed position of the pump connector 70 and a reflection direction of pump light by the mirror 10. In FIG. 8A and FIG. 8B, illustration of the pump laser 7, the probe laser 8, and the deriving portion 19 is omitted.

For example, the pump connector 70 in the optically pumped magnetometer 1D is constituted to include two pump lasers 7. The mirror 10 reflects pump light in the y axis direction such that it is incident on the mirror 11 of the optically pumped magnetometer 1 adjacent thereto in the y axis direction. According to such reflection, the optical paths of pump light in the optically pumped magnetometer 1D become similar to those of pump light in the optically pumped magnetometer 1B described above (refer to FIG. 6). As a result, as illustrated in FIG. 8B, in the optically pumped magnetometer 1D, the same pump light is consecutively incident on the cells 2 and 2r adjacent to each other in the y axis direction. That is, regarding the optical paths of pump light in the optically pumped magnetometer 1D, the optical paths of pump light in the optically pumped magnetometer 1B are applied for both the reference region and the measurement region of each of the channels in the first derivation axis-type gradiometer. In the optically pumped magnetometer 1D, the pump connector 70 is disposed close to the cell 2 or the cell 2r on which pump light is incident first among the four cells 2 or cells 2r in the positive direction of the x axis. In the optically pumped magnetometer 1D, the attenuation detection portion 20 is disposed at a position on which pump light after having passed through the four cells 2 or cells 2r is incident. The optical paths of probe light in the optically pumped magnetometer 1D are similar to those of probe light in the optically pumped magnetometer 1C described above (refer to FIG. 7A and FIG. 7B). In regard to the optical paths of pump light and probe light, it can be said that the optically pumped magnetometer 1D is a combination of the optically pumped magnetometer 1B and the optically pumped magnetometer 1C. With this optically pumped magnetometer 1D as well, there is no need to cause pump light to branch or prepare multiple pump lasers 7 in a manner of corresponding to the number of cell regions. Therefore, the constitution related to pump light can be simplified. Accordingly, it is possible to provide the optically pumped magnetometer 1D which can be miniaturized.

Figure 9:
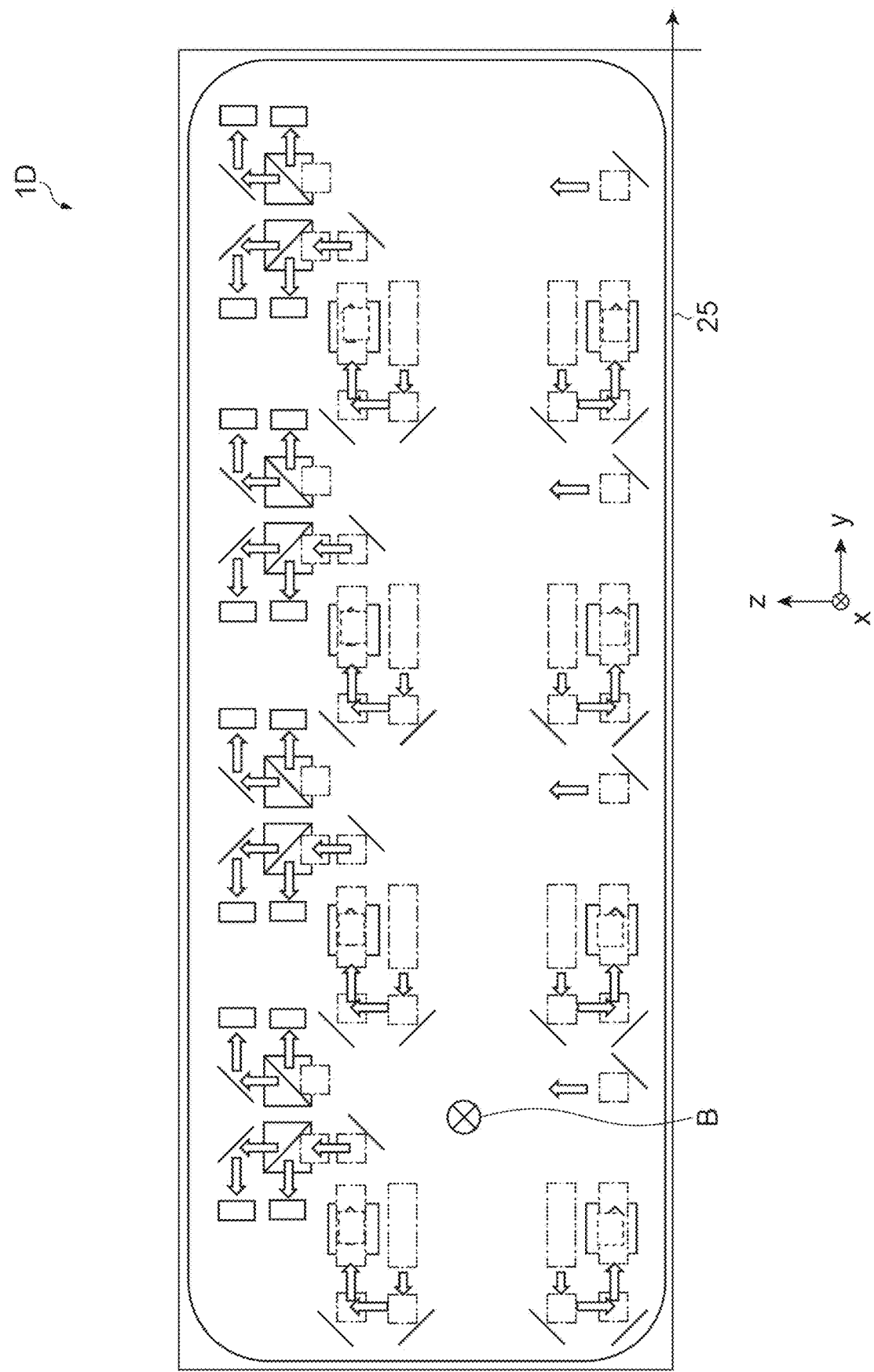
FIG. 9 is a schematic view illustrating a bias magnetic field.

FIG. 9 is a schematic view illustrating a bias magnetic field. For example, in the optically pumped magnetometer 1D illustrated in FIG. 9, four sets of constituents similar to those of the optically pumped magnetometer 1 are disposed at intervals of 10 mm in the y axis direction in a footprint of 60×60 $mm^2$ and derive magnetic fields corresponding to 16 channels. The optically pumped magnetometer 1D may include a coil 25 for forming a bias magnetic field. The coil 25 for forming a bias magnetic field generates a bias magnetic field B in a region having the cells 2 disposed in accordance with a current supplied from a coil power source (not illustrated). For example, the coil 25 for forming a bias magnetic field can serve as a coil system surrounding the optically pumped magnetometer 1D. For example, a direction of the bias magnetic field B is the same direction as the optical paths of pump light passing through the inside of the cell 2 (positive direction of the x axis). A peak frequency of the sensitivity of a magnetic field in the optically pumped magnetometer 1D can be adjusted in accordance with the intensity of the bias magnetic field B. The peak frequency may be changed in accordance with a target to be measured by the optically pumped magnetometer 1D. For example, when the optically pumped magnetometer 1D is used for magnetoencephalographic measurement, the peak frequency of the sensitivity of a magnetic field is within several to several hundred Hz, which is a frequency band of a cerebral magnetic field. As an example, if the coil 25 for forming a bias magnetic field forms the bias magnetic field B of 7 nT, the peak frequency of the optically pumped magnetometer 1D is adjusted to 50 Hz.

Figure 10:
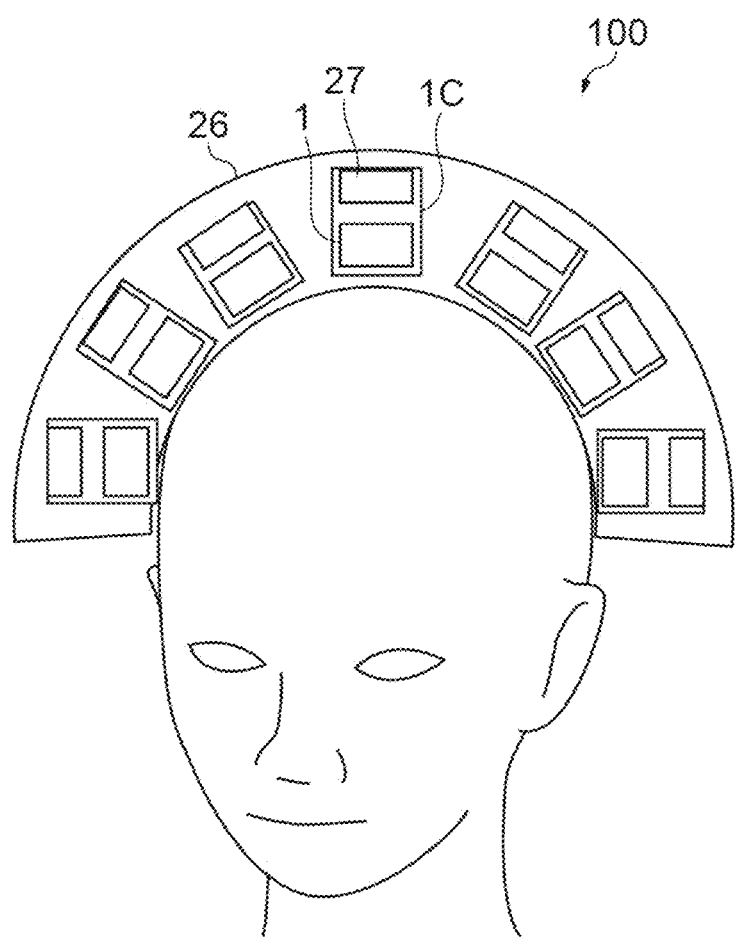
FIG. 10 is a schematic view illustrating a magnetoencephalography.

FIG. 10 is a schematic view illustrating a magnetoencephalography 100 using the optically pumped magnetometer 1C. The magnetoencephalograph 100 includes multiple optically pumped magnetometers 1C and a non-magnetic frame 26. For example, the multiple optically pumped magnetometers 1C are disposed along a measurement target with predetermined intervals therebetween. When optically pumped magnetometers 1C are disposed, the magnetoencephalograph 100 derives magnetic fields corresponding to 192 channels in total. In the optically pumped magnetometer 1, temperatures of the cells 2 and 2r may be adjusted to 180° C., for example. The magnetoencephalograph 100 may include the optically pumped magnetometers 1D in place of the optically pumped magnetometers 1C.

The non-magnetic frame 26 is a helmet-type frame for covering the entire region of the head of a measurement object person in magnetoencephalographic measurement. The non-magnetic frame 26 is constituted using a non-magnetic material such as graphite. The multiple optically pumped magnetometers 1C are fixed to the non-magnetic frame 26 close to the head of a measurement object person. The non-magnetic frame 26 curbs heat transfer to the head of a measurement object person by means of a heat insulating material or the like.

The optically pumped magnetometers 1C includes a reading circuit 27. The reading circuit is a circuit for acquiring detection results of the optically pumped magnetometer 1. For example, the temperature of the reading circuit 27 may be adjusted using a heat insulating material or the like such that it becomes 25° C. The reading circuit 27 may be the detection portions 18 and 18r. In the magnetoencephalograph 100, the deriving portion 19 may be disposed outside. Such a deriving portion 19 may acquire detection results from multiple reading circuits 27 or collectively derive magnetic fields in the multiple optically pumped magnetometers 1C.

In the embodiments, magnitudes of pump light and probe light are not stipulated, but they may be individually formed to have an arbitrary magnitude. For example, probe light may be formed such that a height thereof becomes smaller than a width thereof. A height indicates a size of the optical path in the third direction regarding probe light while being guided to the cell 2. A width indicates a size of the optical path in the first direction regarding probe light while being guided to the cell 2. In this case, the sizes of the mirrors 13, 13r, 14, 14r, 15, and 15r serving as probe light mirrors can be reduced. Accordingly, it is possible to provide the optically pumped magnetometer 1 which can be miniaturized.

What is claimed is:

1. An optically pumped magnetometer comprising:
   at least one cell configured to be filled with an alkali metal vapor, be disposed in a first direction along a measurement target, and form a first cell region and a second cell region on the measurement target;
   a pump laser configured to emit pump light for exciting alkali metal atoms;
   a probe laser configured to emit probe light including first probe light and second probe light for detecting change in a polarization angle caused by a magnetic field in an excited state of the alkali metal atoms;
   a first optical system configured to cause the pump light to be incident on the first cell region in the first direction;
   a second optical system configured to cause the pump light having passed through the first cell region to be incident on the second cell region in the first direction;
   a third optical system configured to cause the first probe light to be incident on the first cell region in a second direction orthogonal to the first direction;
   a fourth optical system configured to cause the second probe light to be incident on the second cell region in the second direction;
   a detection portion configured to detect first probe light having passed through the first cell region and second probe light having passed through the second cell region; and
   a deriving portion configured to derive an intensity of a magnetic field related to a region having the pump light and the first probe light orthogonal to each other from change in the polarization angle of the first probe light within the first cell region and derive an intensity of a magnetic field related to a region having the pump light having passed through the first cell region and the second probe light orthogonal to each other from change in the polarization angle of the second probe light within the second cell region based on detection results of the detection portion,
   wherein the first cell region and the second cell region are formed by multiple cells,
   wherein the multiple cells are disposed away from each other in a direction away from the measurement target, and
   wherein the deriving portion performs noise removal processing by calculating a difference between an intensity of a magnetic field related to an area within the first cell region and an intensity of a magnetic field related to an area within the second cell region.

2. The optically pumped magnetometer according to claim 1,
   wherein at least the one cell has a pair of end surfaces intersecting the first direction with an antireflection film attached thereto.

3. The optically pumped magnetometer,
   wherein the alkali metal is potassium and rubidium,
   wherein a density of the rubidium is lower than a density of the potassium,
   wherein the pump laser emits the pump light for exciting atoms of the rubidium and transferring spin polarization of atoms of the rubidium to atoms of the potassium, and
   wherein the probe laser emits the probe light for detecting change in a polarization angle caused by a magnetic field in an excited state of atoms of the potassium.

4. The optically pumped magnetometer according to claim 1,
   wherein the second optical system causes the pump light having passed through the first cell region to be turned back and be incident on the second cell region.

5. An optically pumped magnetometer comprising:
   at least one cell configured to be filled with an alkali metal vapor, be disposed in a first direction along a measurement target, and form a first cell region and a second cell region on the measurement target;
   a pump laser configured to emit pump light for exciting alkali metal atoms;
   a probe laser configured to emit probe light including first probe light and second probe light for detecting change in a polarization angle caused by a magnetic field in an excited state of the alkali metal atoms;
   a first optical system configured to cause the pump light to be incident on the first cell region in the first direction;
   a second optical system configured to cause the pump light having passed through the first cell region to be incident on the second cell region in the first direction;
   a third optical system configured to cause the first probe light to be incident on the first cell region in a second direction orthogonal to the first direction;

a fourth optical system configured to cause the second probe light to be incident on the second cell region in the second direction;
a detection portion configured to detect first probe light having passed through the first cell region and second probe light having passed through the second cell region; and
a deriving portion configured to derive an intensity of a magnetic field related to a region having the pump light and the first probe light orthogonal to each other from change in the polarization angle of the first probe light within the first cell region and derive an intensity of a magnetic field related to a region having the pump light having passed through the first cell region and the second probe light orthogonal to each other from change in the polarization angle of the second probe light within the second cell region based on detection results of the detection portion,
wherein the first cell region and the second cell region are formed by multiple cells, and
wherein the multiple cells are disposed away from each other in a direction orthogonal to the first direction and extending along the measurement target.

6. The optically pumped magnetometer according to claim 5,
wherein at least the one cell has a pair of end surfaces intersecting the first direction with an antireflection film attached thereto.

7. The optically pumped magnetometer according to claim 5,
wherein the alkali metal is potassium and rubidium,
wherein a density of the rubidium is lower than a density of the potassium,
wherein the pump laser emits the pump light for exciting atoms of the rubidium and transferring spin polarization of atoms of the rubidium to atoms of the potassium, and
wherein the probe laser emits the probe light for detecting change in a polarization angle caused by a magnetic field in an excited state of atoms of the potassium.

8. The optically pumped magnetometer according to claim 5,
wherein the second optical system causes the pump light having passed through the first cell region to be turned back and be incident on the second cell region.

9. An optically pumped magnetometer comprising:
at least one cell configured to be filled with an alkali metal vapor, be disposed in a first direction along a measurement target, and form a first cell region and a second cell region on the measurement target;
a pump laser configured to emit pump light for exciting alkali metal atoms;
a probe laser configured to emit probe light including first probe light and second probe light for detecting change in a polarization angle caused by a magnetic field in an excited state of the alkali metal atoms;
a first optical system configured to cause the pump light to be incident on the first cell region in the first direction;
a second optical system configured to cause the pump light having passed through the first cell region to be incident on the second cell region in the first direction;
a third optical system configured to cause the first probe light to be incident on the first cell region in a second direction orthogonal to the first direction;
a fourth optical system configured to cause the second probe light to be incident on the second cell region in the second direction;
a detection portion configured to detect first probe light having passed through the first cell region and second probe light having passed through the second cell region; and
a deriving portion configured to derive an intensity of a magnetic field related to a region having the pump light and the first probe light orthogonal to each other from change in the polarization angle of the first probe light within the first cell region and derive an intensity of a magnetic field related to a region having the pump light having passed through the first cell region and the second probe light orthogonal to each other from change in the polarization angle of the second probe light within the second cell region based on detection results of the detection portion,
wherein the first cell region and the second cell region are away from each other in a direction away from the measurement target and are formed by one cell, and
wherein the deriving portion performs noise removal processing by calculating a difference between an intensity of a magnetic field related to an area within the first cell region and an intensity of a magnetic field related to an area within the second cell region.

10. The optically pumped magnetometer according to claim 9,
wherein at least the one cell has a pair of end surfaces intersecting the first direction with an antireflection film attached thereto.

11. The optically pumped magnetometer according to claim 9,
wherein the alkali metal is potassium and rubidium,
wherein a density of the rubidium is lower than a density of the potassium,
wherein the pump laser emits the pump light for exciting atoms of the rubidium and transferring spin polarization of atoms of the rubidium to atoms of the potassium, and
wherein the probe laser emits the probe light for detecting change in a polarization angle caused by a magnetic field in an excited state of atoms of the potassium.

12. The optically pumped magnetometer according to claim 9,
wherein the second optical system causes the pump light having passed through the first cell region to be turned back and be incident on the second cell region.

13. An optically pumped magnetometer further comprising:
at least one cell configured to be filled with an alkali metal vapor, be disposed in a first direction along a measurement target, and form a first cell region and a second cell region on the measurement target;
a pump laser configured to emit pump light for exciting alkali metal atoms;
a probe laser configured to emit probe light including first probe light and second probe light for detecting change in a polarization angle caused by a magnetic field in an excited state of the alkali metal atoms;
a first optical system configured to cause the pump light to be incident on the first cell region in the first direction;
a second optical system configured to cause the pump light having passed through the first cell region to be incident on the second cell region in the first direction;

a third optical system configured to cause the first probe light to be incident on the first cell region in a second direction orthogonal to the first direction;

a fourth optical system configured to cause the second probe light to be incident on the second cell region in the second direction;

a detection portion configured to detect first probe light having passed through the first cell region and second probe light having passed through the second cell region;

a deriving portion configured to derive an intensity of a magnetic field related to a region having the pump light and the first probe light orthogonal to each other from change in the polarization angle of the first probe light within the first cell region and derive an intensity of a magnetic field related to a region having the pump light having passed through the first cell region and the second probe light orthogonal to each other from change in the polarization angle of the second probe light within the second cell region based on detection results of the detection portion; and an attenuation detection portion configured to detect attenuation of the pump light having passed through the second cell region, wherein the deriving portion revises at least one of an intensity of a magnetic field related to an area within the first cell region and an intensity of a magnetic field related to an area within the second cell region based on detection results of the attenuation detection portion.

14. The optically pumped magnetometer according to claim 13, wherein at least the one cell has a pair of end surfaces intersecting the first direction with an antireflection film attached thereto.

15. The optically pumped magnetometer according to claim 13, wherein the alkali metal is potassium and rubidium, wherein a density of the rubidium is lower than a density of the potassium, wherein the pump laser emits the pump light for exciting atoms of the rubidium and transferring spin polarization of atoms of the rubidium to atoms of the potassium, and wherein the probe laser emits the probe light for detecting change in a polarization angle caused by a magnetic field in an excited state of atoms of the potassium.

16. The optically pumped magnetometer according to claim 13, wherein the second optical system causes the pump light having passed through the first cell region to be turned back and be incident on the second cell region.

* * * * *